United States Patent [19]

Amamoto et al.

[11] Patent Number: 5,210,483

[45] Date of Patent: May 11, 1993

[54] BURST SIGNAL SPECTRUM MEASURING SYSTEM WITH STEPWISE SWEEPING

[75] Inventors: Narushi Amamoto, Fujisawa; Hiroyoshi Oka; Takehiko Sato, both of Atsugi; Aiichi Katayama, Isehara, all of Japan

[73] Assignee: Anritsu Corporation, Tokyo, Japan

[21] Appl. No.: 767,074

[22] Filed: Sep. 26, 1991

[30] Foreign Application Priority Data

Sep. 29, 1990 [JP] Japan .................................. 2-261877

[51] Int. Cl.⁵ .................. G01R 23/16; G01R 23/173
[52] U.S. Cl. ................... 324/76.27; 324/619; 324/76.26; 342/100
[58] Field of Search ............... 324/77 CS, 77 B, 615, 324/619, 77 C; 342/94, 100, 192, 194; 364/485

[56] References Cited

U.S. PATENT DOCUMENTS

| 4,007,423 | 2/1977 | Dickinson | 324/77 C |
| 4,802,106 | 1/1989 | Saito | 324/77 CS |
| 4,845,691 | 7/1989 | Itaya | 324/77 C |
| 5,038,096 | 8/1991 | Obie | 324/77 B |
| 5,075,618 | 12/1991 | Katayama | 324/77 CS |

FOREIGN PATENT DOCUMENTS 62-189669 12/1987 Japan .
63-132178 6/1988 Japan .
2-231576 9/1990 Japan .

Primary Examiner—Kenneth A. Wieder
Assistant Examiner—Jose M. Solis
Attorney, Agent, or Firm—Frishauf, Holtz, Goodman & Woodward

[57] ABSTRACT

A measuring unit converts a measuring signal into an intermediate frequency band of a predetermined bandwidth and detects the intermediate frequency band while a reception frequency is set variable by variably controlling a local oscillation frequency of a local oscillator. A waveform memory stores the magnitude of a detection signal output from the measuring unit in correspondence with the frequency. An analyzing unit analyzes a frequency component included in a signal to be measured, on the basis of a storage value of the waveform memory. An analysis target frequency data setting unit sets frequency data of a desired analysis target frequency or interval frequency data thereof. A sweep control unit changes the reception frequency of the measuring unit into the desired analysis target frequency corresponding to the frequency data set by the analysis target frequency data setting unit and outputs an address signal corresponding to the received analysis target frequency to the waveform memory every time a signal synchronized with an ON/OFF change of the signal to be measured is received.

9 Claims, 16 Drawing Sheets

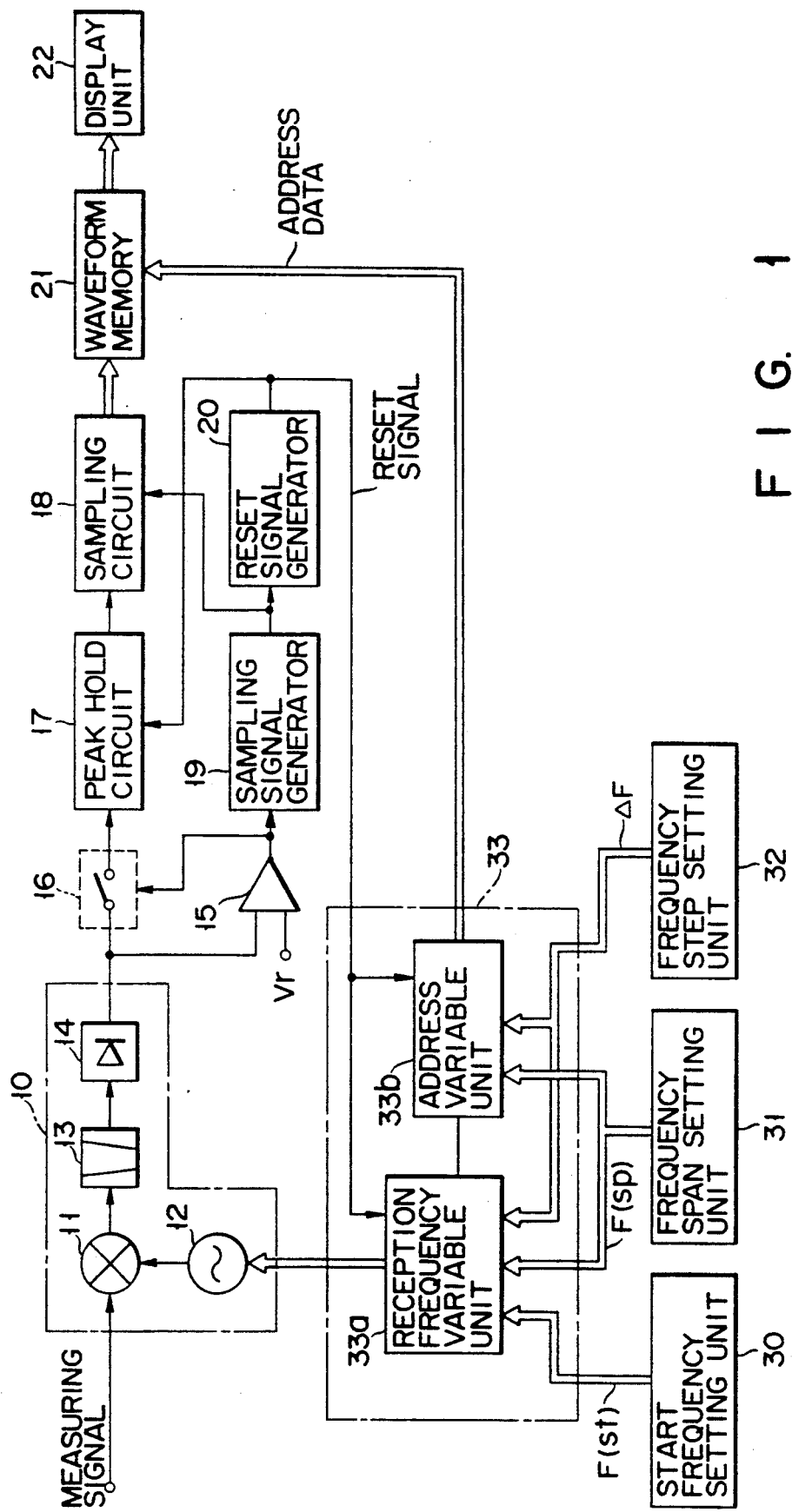
F I G. 1

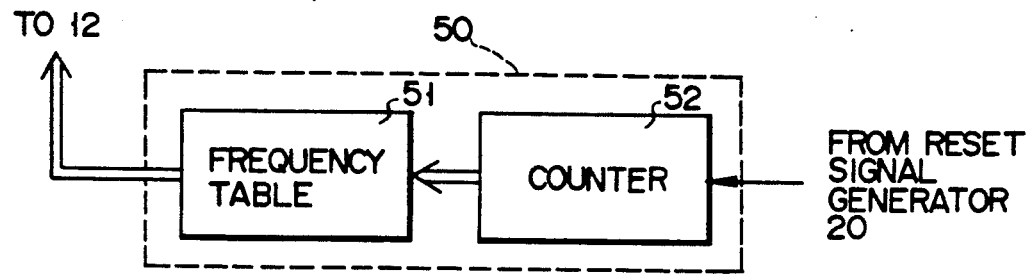
F I G. 5
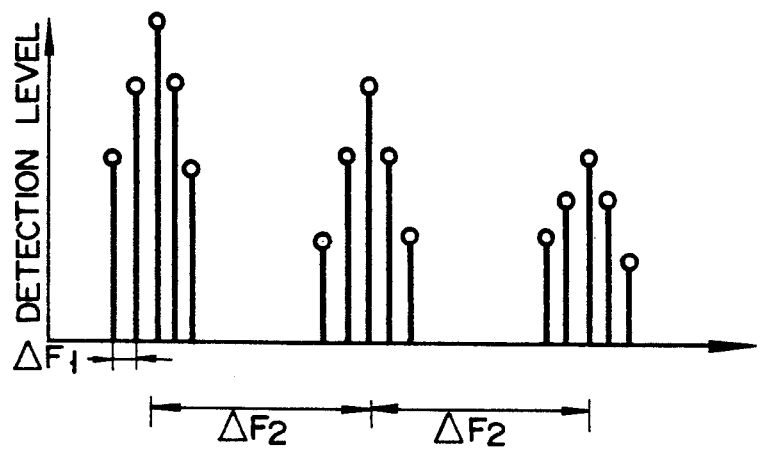
F I G. 6
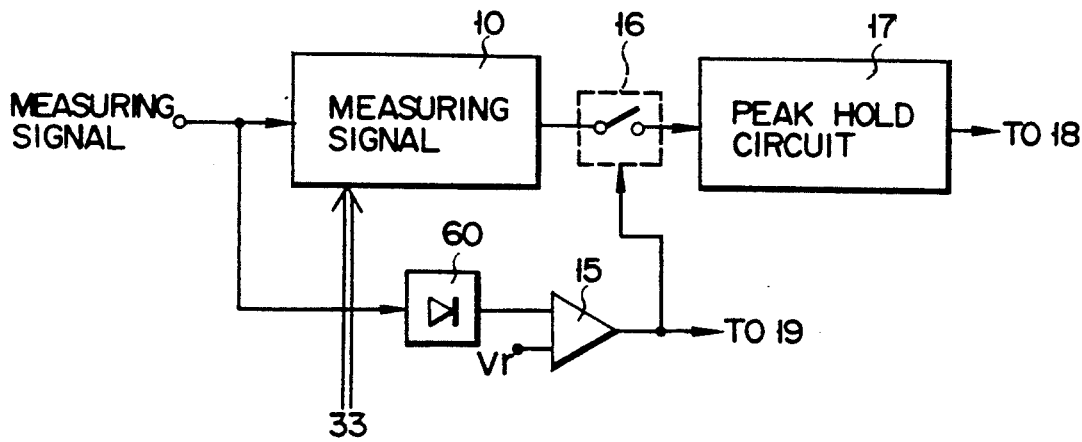
F I G. 7

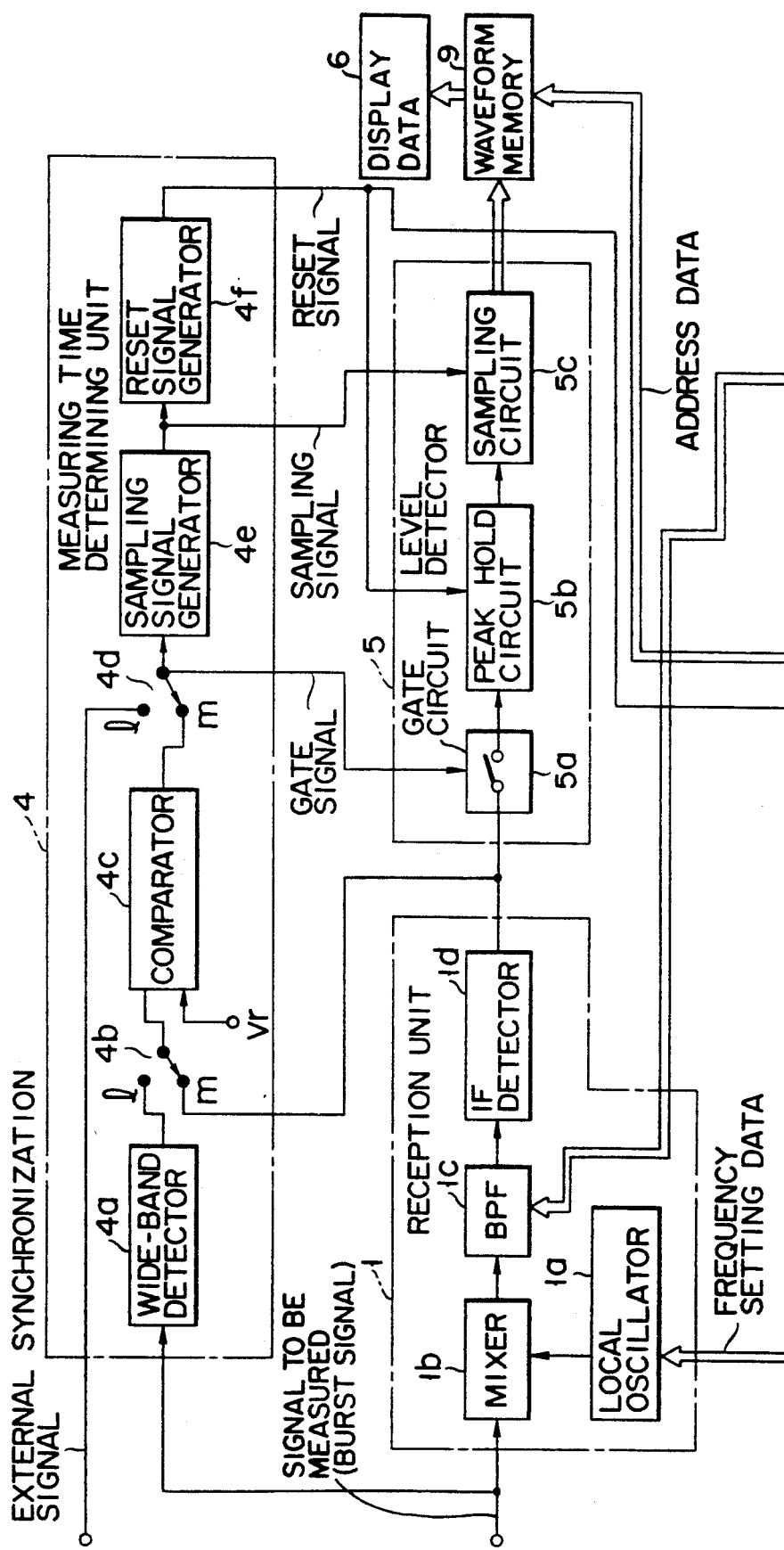
FIG. 9-I

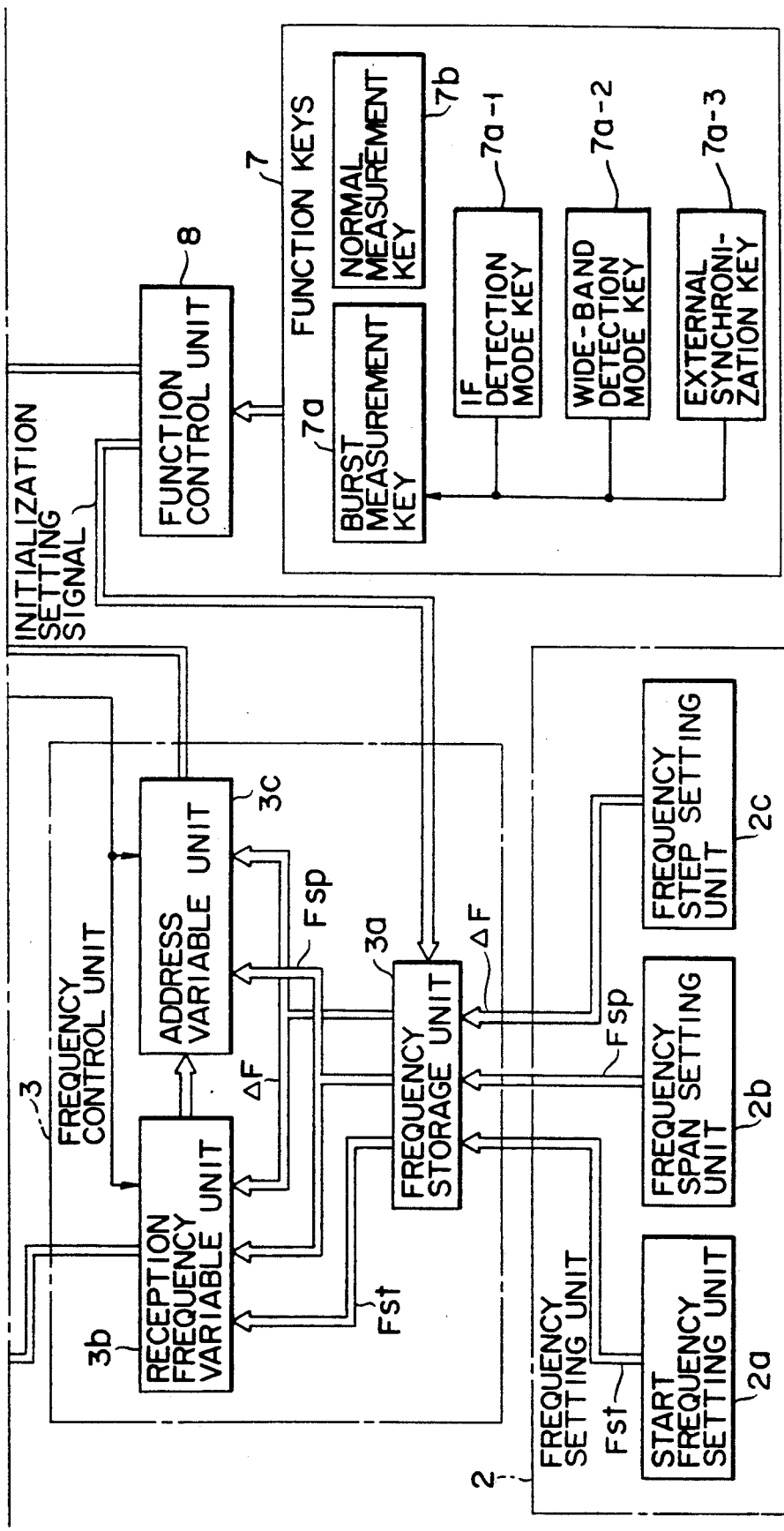
FIG. 9-II

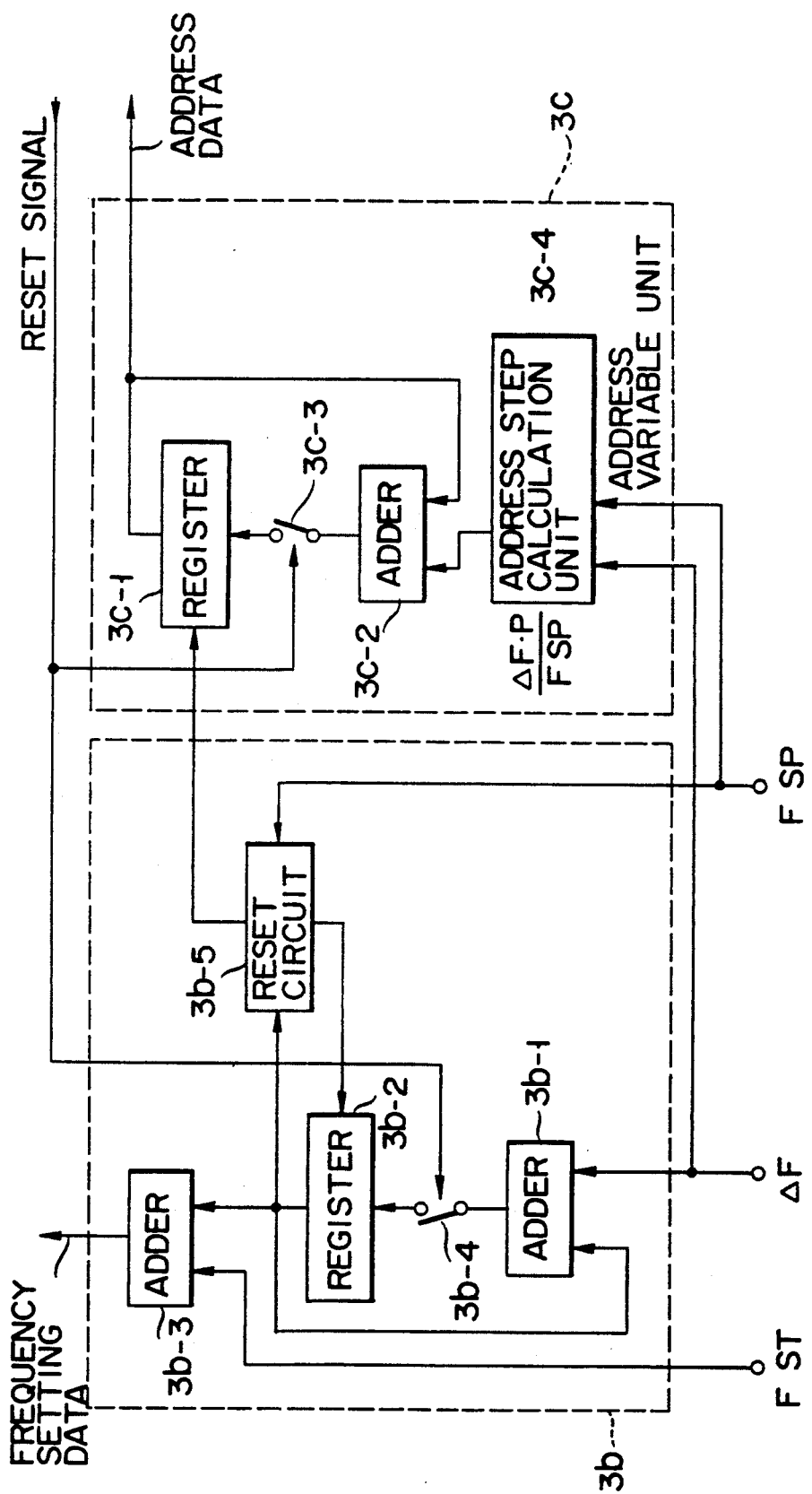
F I G. 10

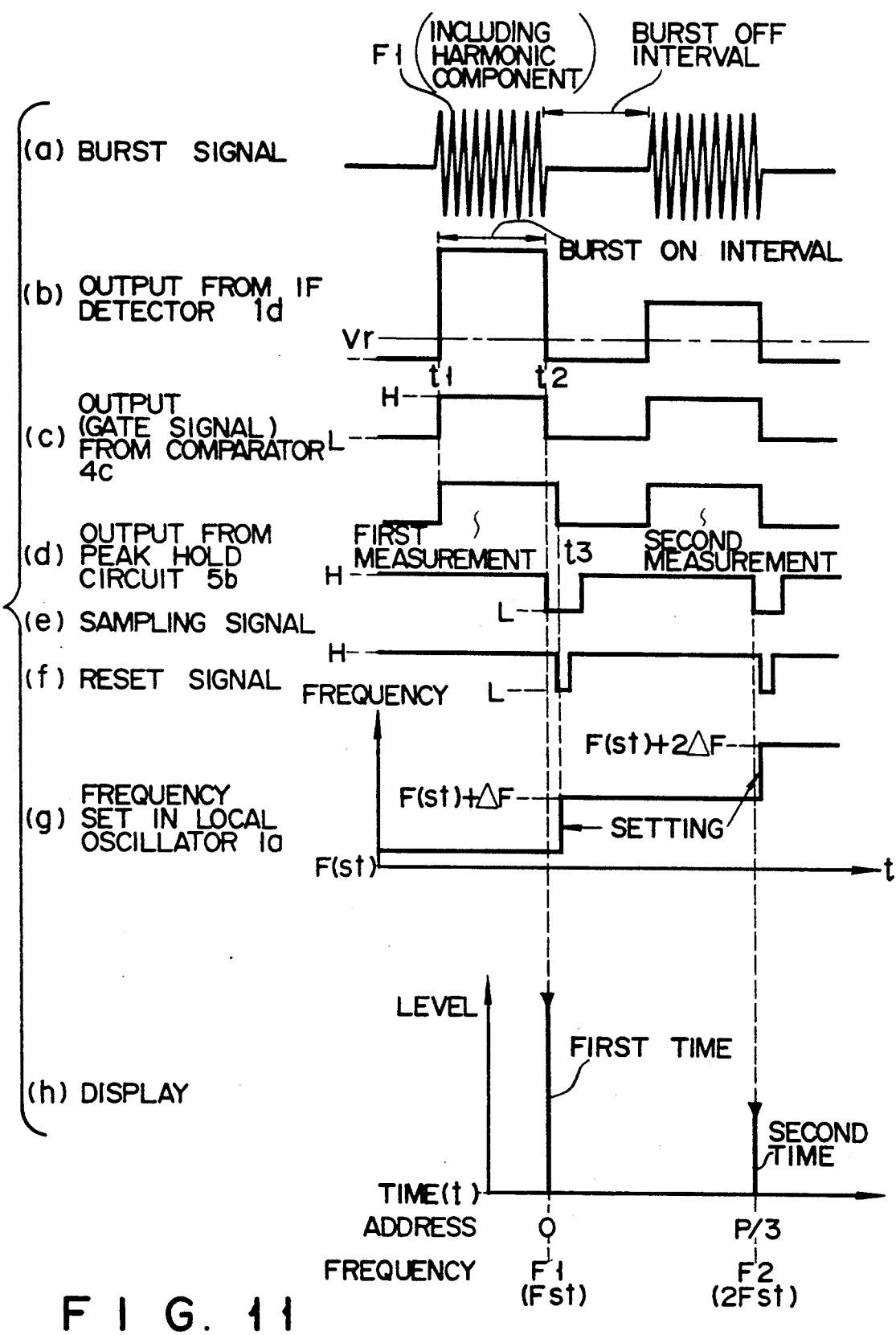
F I G. 11

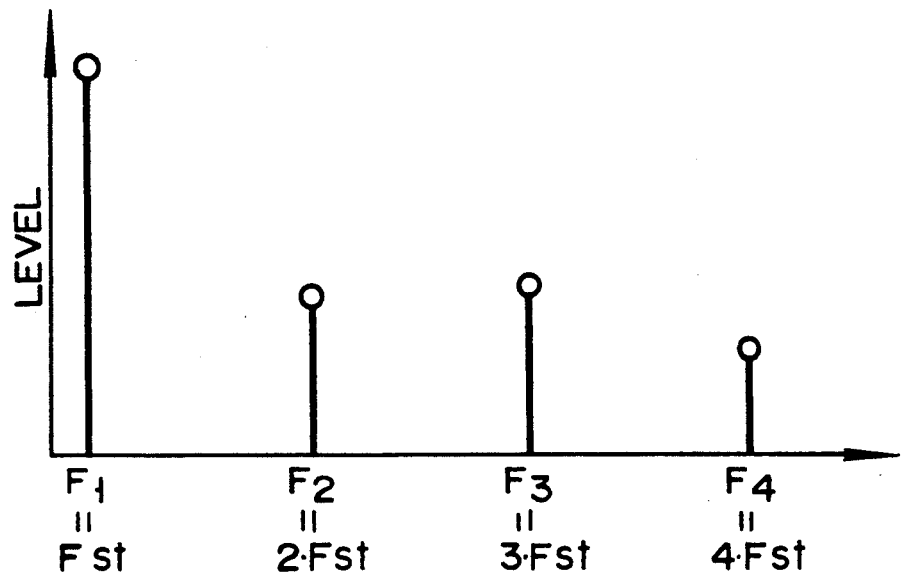
F I G. 13
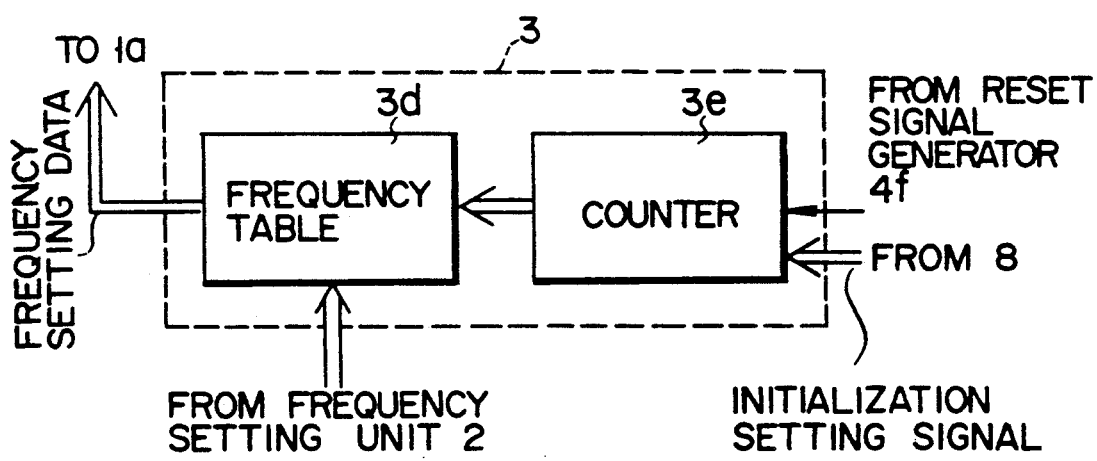
F I G. 14

BURST SIGNAL SPECTRUM MEASURING SYSTEM WITH STEPWISE SWEEPING

BACKGROUND OF THE INVENTION

1. Field of the Invention

The present invention generally relates to a spectrum analyzing system for receiving and sweeping a measuring signal to analyze a spectrum thereof and, more particularly, to a spectrum analyzer for discretely selecting and receiving a frequency component included in a burst signal and measuring the frequency component.

2. Description or the Related Art

A conventional spectrum analyzer has an arrangement of FIG. 17 to display a frequency component included in a measuring signal as a series of spectral waveforms on a screen.

Referring to FIG. 17, reference numeral 1 denotes a measuring unit for sweeping and detecting a measuring signal. The measuring unit 1 is arranged to cause a mixer 3 to frequency-convert the input measuring signal in accordance with a local oscillation signal from a sweep oscillator 2 and cause a detector 5 to detect a signal passing through a band-pass filter 4.

Reference numeral 7 denotes a sweep control circuit for sweeping and controlling the frequency of the local oscillation signal in accordance with a sweep signal.

Reference numeral 8 denotes a display unit for displaying a detection output from the detector 5 on a frequency axis. A spectral waveform of the measuring signal falling within the frequency range determined by the sweep signal is displayed on the screen of the display unit 8.

For example, when a measuring signal having a frequency $F_1$ shown in FIG. 18A is input, assuming that a sweep signal corresponding to the frequency range from a start frequency $F_0$ lower than the frequency $F_1$ to a frequency several times the frequency $F_1$ is output, as shown in FIG. 18B, a spectral waveform shown in FIG. 18C is displayed on the screen of the display unit 8.

When a burst signal of the frequency $F_1$ which is pulse-modulated with a period shorter than a sweep period of the sweep signal (as shown in (b) of FIG. 19) is, however, input, as shown in (a) of FIG. 19, the spectrum of a nonsignaling period $T_0$ contains only noise components, as shown in (c) of FIG. 19. As a result, the spectrum of the measuring signal present within the range of the reception frequency swept during the non-signaling period $T_0$ cannot be observed.

In order to eliminate the unobservable range, the sweep period may be shortened. However, since the band of the band-pass filter 4 and the response time of the detector 5 are limited, the conventional spectrum analyzer cannot cope with a high-speed burst modulated signal.

In summary, a general spectrum analyzer comprises a local oscillator and a mixer. The local oscillator is frequency-swept for a predetermined sweep period to sequentially convert signals in a frequency range to be measured into intermediate frequency (IF) signals. The bandwidth of the received IF signals are narrowed by a band-pass filter having a desired bandwidth. The frequency-analyzed signals are then detected. The swept and analyzed signal is displayed such that its frequency is plotted along the abscissa and the corresponding signal amplitude is plotted along the ordinate.

When the above general spectrum analyzer is used to perform spectrum analysis upon reception of a burst signal (e.g., a signal obtained such that a high-frequency signal $F_1$ amplitude-modulated by a rectangular low-frequency signal $F_0$ used as in a television system repeats ON and OFF intervals at a period of the low-frequency signal, as shown in FIG. 20), the sweep time of the spectrum analyzer is not sufficiently matched with the ON interval (or the OFF interval) of the burst signal. As a result, a satisfactory measurement result cannot be obtained.

The spectrum of the burst signal shown in FIG. 20 has a well-known distribution, as shown in FIG. 21. This distribution is measured and observed with the general spectrum analyzer for performing so-called continuous sweep for a sweep time long enough to render the ON/OFF intervals of the burst signal negligible.

When the sweep time is shortened in this general spectrum analyzer, the ON/OFF intervals of the burst signals pose a serious problem, as shown in FIG. 22.

That is to say, FIG. 22 is an example of a measurement of a harmonic wave of a signal $F_1$ included in the burst signal, as shown in (a) of FIG. 22. As shown in (b) of FIG. 22, the frequency of a local oscillator is swept to receive signals of the measuring frequency $F_1$ to frequency $F_4$ by a sweep voltage (the frequency of the local oscillator is a frequency as a sum of the measuring frequency and an intermediate frequency $F_{if}$). Since the burst signal of the input signal is set in a non-signaling state during the OFF interval $T_0$, the measuring frequencies $F_1$ and $3F_1$ received in this state cannot be measured. The measuring frequencies $2F_1$ and $4F_1$ can be measured because the burst signal is present during the reception time.

Strong demand has arisen for a spectrum analyzer compatible with a burst signal in accordance with recent developments in the field of communications.

Prior art for analyzing high-frequency signals included in burst signals by improving conventional spectrum analyzers are exemplified by Published Unexamined Japanese Patent Application No. 63-132178 (to be referred to as Reference 1 hereinafter), Published Unexamined Japanese Utility Model Application No. 62-189669 (to be referred to as Reference 2 hereinafter), and Published Unexamined Japanese Patent Application No. 2-231576 (to be referred to as Reference 3 hereinafter). These references will be described below.

(1) References 1 and 2

In each of References 1 and 2, the following arrangement is provided in the general spectrum analyzer.

(1-1) A gate signal corresponding to the ON interval of the burst signal is formed.

(1-2) The local oscillator is caused to perform continuous analog frequency sweep during only the ON interval in accordance with the gate signal, and this frequency sweep is stopped in the OFF interval while the frequency at the end of the ON interval is kept maintained.

(1-3) The signal obtained during the frequency-sweep ON interval is detected, and the signal is displayed in correspondence with the spectral frequency.

In addition, in Reference 2, the waveforms at the leading and trailing edges of the ON interval of the burst signal are formed not to adversely affect measurement by the spectrum analyzer.

(2) Reference 3

The spectrum analyzer in Reference 3 is the same as the general spectrum analyzer up to detection of the spectrum. Continuous analog frequency sweep is performed regardless of the OFF/ON intervals of the burst signal, and the spectrum is detected. The detected and output spectrum data is processed as follows.

(2-1) A gate signal corresponding to the ON interval of the burst signal is formed.

(2-2) Only data in the ON interval of the burst signal is extracted from the detected and output spectrum data and is stored. The stored data is displayed in correspondence with the frequency.

The prior art of References 1, 2, and 3 discloses a technique aimed at obtaining and displaying the whole spectrum distribution of the high-frequency signal included in the burst signal as continuous spectrum data independently of the ON/OFF timings of the burst signal. For example, even if all components from a trailing portion near −70 dB of the high-frequency signal included in the burst signal to a peak value near 0 dB are to be measured, continuous display as in the general spectrum analyzer incompatible with a conventional burst signal can be performed, resulting in convenience.

A plurality of specific discrete frequency levels may often be measured as an application of a spectrum analyzer. In this case, the above spectrum analyzers of References 1, 2, and 3 have the following drawbacks ①, ②. The measurement of a plurality of specific discrete frequency levels is exemplified as follows. The level of the frequency $F_1$ ($F_1<F_2<F_3<F_4$) of the burst signal output from a transmitter must be 10 dBm or more and the levels of the frequencies $F_2$, $F_3$, and $F_4$ must be −60 dB or less with respect to the level of the frequency $F_0$.

① When the level of only a specific frequency is to be measured, measurement of the whole spectral distribution of frequency components near the specific frequency results in a waste of time.

The sweep time generally occupies most of the total measuring time in the spectrum analyzer. This sweep time depends on condition (1) below serving as an optimal operation condition which minimizes the measurement errors:

$$\text{Sweep Time} \geq \frac{\text{Sweep Frequency Span}}{(\text{Measurement Resolution Bandwidth})^2} \times K \quad (1)$$

where the sweep frequency span is the frequency range to be measured by one sweep cycle or the corresponding sweep frequency range of the local oscillator, the sweep time is the time required to sweep the sweep frequency span, the measurement resolution bandwidth is the bandwidth for determining a resolution for frequency-analyzing the intermediate frequency signal, the bandwidth being normally determined by the bandwidth of the band-pass filter, and K is a constant.

According to equation (1), when the sweep frequency span is increased, the sweep time is prolonged, and the measuring time is prolonged. For example, in the above measurement associated with the transmitter, the sweep frequency span becomes almost $F_3$, and a measurement time corresponding to this sweep frequency span is required.

② The burst signals as a signal to be measured do not necessarily have a predetermined amplitude during the ON interval. In particular, since the amplitude of a PSK signal such as a π/4-shifted QPSK signal is changed by 10 dB or more, a measurement result having high reproducibility cannot be obtained by segmenting and analyzing one burst signal. In the prior art, since frequency sweep is performed within the time when the burst signal is present, the ON interval of one burst signal is segmented in analysis of a plurality of frequency points. This analysis is equivalent to that performed by segmenting one burst signal.

SUMMARY OF THE INVENTION

It is, therefore, an object of the present invention to provide a new and improved spectrum analyzing apparatus which can measure a spectrum of a burst signal within a short period of time.

It is, therefore, another object of the present invention to provide a new and improved method for measuring a spectrum of a burst signal, which can shorten a measuring time.

According to the present invention, a desired high-frequency signal is discretely selected from high-frequency signals synchronized with the ON interval and included in units of ON intervals, thereby performing spectrum analysis.

According to the present invention, a frequency to be measured is not set in a level measuring time (i.e., an ON interval of the burst signal), but is set during the OFF interval of the burst signal. That is, the level of the burst signal is not swept during the measurement, and an influence of the sweep time in equation (1) can be prevented. Therefore, the level of the discrete specific frequency component can be measured within a short period of time.

When reception and detection of the input signal is performed while the reception frequency is kept unchanged for the sequentially received burst components, the time zone for analyzing each frequency component and the time zone for receiving each burst component can always have a predetermined relationship. For example, it is possible to perform analysis of only a 20-μm interval from the leading edge of a burst component having a 100-μs duration at all frequency points.

According to a first aspect of the present invention, there is provided a spectrum analyzing apparatus comprising:

receiving means for receiving a burst signal to be measured, converting the burst signal into an intermediate frequency signal in accordance with a local oscillation signal having a predetermined swept frequency, and detecting the intermediate frequency signal, thereby outputting a signal representing a spectrum of the burst signal;

frequency setting means for setting frequency information for determining a plurality of measuring frequencies from a first measuring frequency to an nth (where n is a natural number) measuring frequency;

measuring time determining means for determining measurement start and end times in association with the burst signal and for outputting measurement start and end signals corresponding to the measurement start and end times;

frequency control means for determining a desired number of measuring frequencies from an ith (where $1 \leq i < n$) measuring frequency to a kth (where $i < k \leq n$) measuring frequency in accordance with the frequency information set by the frequency setting means, and for stepwise-setting the predetermined swept frequency of the local oscillation signal in the receiving means at timings in accordance with an initialization signal and the measurement end signal from the measuring time determining means so as to sequentially output spectrum signals respectively corresponding to the desired number of measuring frequencies from the ith to kth measuring frequencies from the receiving means;

level detecting means for gating an output signal from the receiving means between reception timings of the measurement start and end signals from the measuring time determining means, and sequentially detecting levels of the ith to kth measuring frequency components included in the burst signal as spectrum data in accordance with the gated output signal;

waveform memory means for storing the spectrum data sequentially detected by the level detecting means at an address corresponding to the predetermined sweep frequency set by the frequency control means; and display means for developing and displaying the spectrum data representing the ith to kth measuring frequency component levels stored in the waveform memory means on a frequency axis corresponding to the address.

According to a second aspect of the present invention, there is provided a method for measuring a spectrum of a burst signal, the method comprising the steps of:

receiving a burst signal to be measured, converting the burst signal into an intermediate frequency signal in accordance with a local oscillation signal having a predetermined swept frequency, detecting the intermediate frequency signal, and outputting a signal representing a spectrum of the burst signal;

preparing a predetermined number n of measuring frequencies;

setting the sweep frequency of the local oscillation signal to a frequency for receiving a first measuring frequency of the predetermined number n of measuring frequencies;

performing first measuring time determination for determining start and end times of a first measuring time in correspondence with a first burst portion of the burst signal;

performing first level detection for detecting a level of the first measuring frequency included in the burst signal between the start and end times of the first measuring time in accordance with the signal representing the spectrum of the burst signal;

performing first next-stage setting for setting the sweep frequency of the local oscillation signal to a frequency for receiving a second measuring frequency of the predetermined number n of measuring frequencies after the end time of the first measuring time;

performing second measuring time determination for determining start and end times of the second measuring time in correspondence with a second burst portion of the burst signal;

performing second level detection for detecting a level of the second measuring frequency included in the burst signal between the start and end times of the second measuring time in accordance with the signal representing the spectrum of the burst signal;

performing second next-stage setting for setting the sweep frequency of the local oscillation signal to an oscillation frequency for receiving a third measuring frequency of the predetermined number n of measuring frequencies after the end time of the second measuring time;

repeatedly performing operations until nth measuring time determination, nth level detection, and (n−1)th next-stage setting; and displaying the levels of the measuring frequencies obtained in the first level detection to the nth level detection in correspondence with the measuring frequencies.

According to a third aspect of the present invention, there is provided a method for measuring a spectrum of a burst signal using a spectrum analyzer for receiving an input signal, converting the input signal into an intermediate frequency signal in accordance with a local oscillation signal of a predetermined swept frequency oscillated by a local oscillator, detecting the intermediate frequency signal, and outputting spectrum data of the input signal, the method comprising the steps of:

preparing a predetermined number n of measuring frequencies;

setting the local oscillator to an oscillation frequency for receiving a first measuring frequency of the predetermined number n of measuring frequencies;

performing first measuring time determination for determining start and end times of a first measuring time in correspondence with a first burst portion of the burst signal;

performing first level detection for detecting a level of the first measuring frequency included in the burst signal between the start and end times of the first measuring time in accordance with the spectrum data from the spectrum analyzer;

performing first next-stage setting for setting the local oscillator to an oscillation frequency for receiving a second measuring frequency of the predetermined number n of measuring frequencies after the end time of the first measuring time;

performing second measuring time determination for determining start and end times of a second measuring time in correspondence with a second burst portion of the burst signal;

performing second level detection for detecting a level of a second measuring frequency included in the burst signal between the start and end times of the second measuring time in accordance with the spectrum data from the spectrum analyzer;

performing second next-stage setting for setting the local oscillator to an oscillation frequency for receiving a third measuring frequency of the predetermined number n of measuring frequencies after the end time of the second measuring time;

repeatedly performing operations until nth measuring time determination, nth level detection, and (n−1)th next-stage setting; and displaying the levels of the measuring frequencies obtained from the first level detection to the nth level detection in correspondence with the measuring frequencies.

According to a fourth aspect of the present invention, there is provided a spectrum analyzer comprising:

a measuring unit for converting a measuring signal into an intermediate frequency band of a predetermined bandwidth and detecting the intermediate frequency band while a reception frequency is set variable by variably controlling a local oscillation frequency of a local oscillator;

a waveform memory for storing a magnitude of a detection signal output from the measuring unit in correspondence with a frequency;

means for analyzing a frequency component included in a signal to be measured, on the basis of a storage value of the waveform memory;

analysis target frequency data setting means for setting frequency data of a desired analysis target frequency or interval frequency data thereof; and sweep control means for changing the reception frequency of the measuring unit into the desired analysis target frequency corresponding to the frequency data set by the analysis target frequency data setting means and for outputting an address signal corresponding to the received analysis target frequency to the waveform memory every time a signal synchronized with an ON/OFF change of the signal to be measured is received.

With the above arrangement, since the reception frequency corresponding to the measuring signal is set variable stepwise in synchronism with the ON/OFF change of the measuring signal, the desired analysis target frequency signals are sequentially received, and their detection outputs are sequentially stored at addresses of the waveform memory in correspondence with the analysis target frequencies.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification illustrate presently preferred embodiments of the invention and, together with the general description given above and the detailed description of the preferred embodiments given below, serve to explain the principles of the invention.

FIG. 1 is a block diagram showing an arrangement of the first embodiment of the present invention;

FIG. 5 is a block diagram showing an arrangement of a modification of FIG. 1;

FIG. 6 is a view showing a display screen of the modification shown in FIG. 5;

FIGS. 7 and 8 are block diagrams showing other modifications of the present invention;

FIGS. 9-I and 9-II are block diagrams showing an arrangement of the second embodiment of the present invention;

FIG. 10 is a block diagram showing an arrangement of the main part of FIGS. 9-I and 9-II;

FIG. 11 is a timing chart for explaining an operation of the second embodiment;

FIG. 13 is a view showing a display screen of the second embodiment;

FIG. 14 is a block diagram showing the main part of a modification of FIG. 9;

FIG. 1 is a block diagram showing an arrangement of a conventional apparatus.

DETAILED DESCRIPTION OF THE PREFERRED EMBODIMENTS

Figure 2:
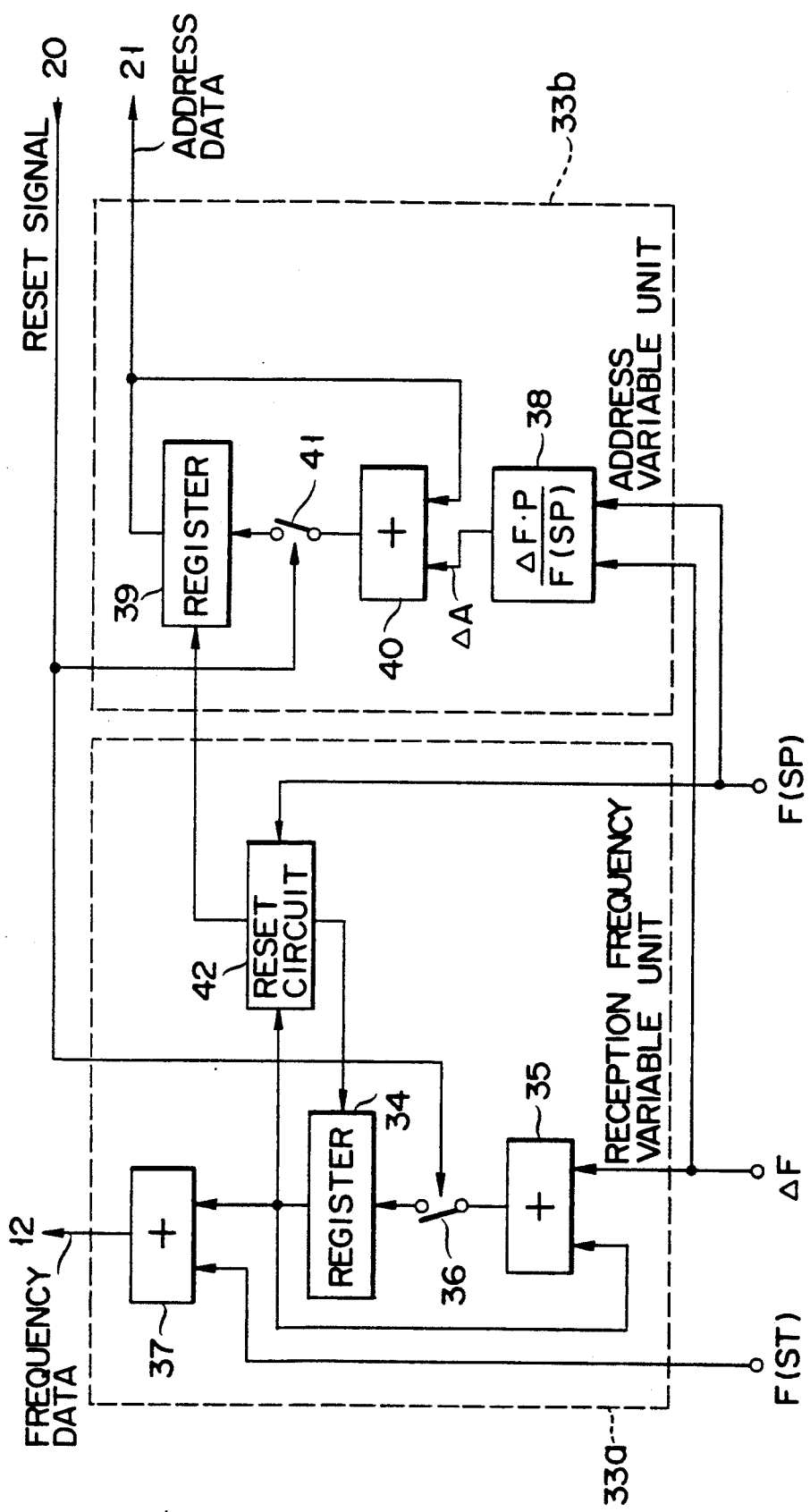
FIG. 2 is a block diagram showing an arrangement of the main part of FIG. 1.

Reference will now be made in detail to the presently preferred embodiments of the invention as illustrated in the accompanying drawings, in which like reference characters designate like or corresponding parts throughout the several drawings.

Several embodiments of the present invention will be made with reference to the accompanying drawings.

FIG. 1 is a block diagram showing an arrangement of a spectrum analyzer according to the first embodiment of the present invention.

Referring to FIG. 1, a measuring unit 10 frequency-converts a measuring signal input to a mixer 11 into an intermediate frequency band in accordance with a local oscillation signal from a local oscillator 12, and causes a detector 14 to detect a signal passing through a band-pass filter 13. The bandwidth of this band-pass filter 13 determines the resolution of this spectrum analyzer.

This local oscillator 12 comprises a synthesizer type oscillator having extremely high frequency stability to output a local oscillation signal having a frequency higher than the input frequency data by a center frequency (intermediate frequency) of the band-pass filter 13.

A comparator 15 compares an output voltage from the detector 14 with a reference voltage Vr. When a detection output voltage exceeding the reference voltage Vr is input to the comparator 15, its output is set at "H" level.

A switch 16 is kept on while the output from the comparator 15 is kept at "H" level. A peak hold circuit 17 holds a peak value of the detection output input through the switch 16.

A sampling circuit 18 samples the peak value held by the peak hold circuit 17 and converts the peak value into a digital value.

A sampling signal generator 19 outputs a sampling pulse synchronized with a trailing edge of an output from the comparator 15 to the sampling circuit 18. A reset signal generator 20 outputs a reset signal slightly delayed from the sampling signal to the peak hold circuit 17, thereby resetting the peak hold circuit 17.

A waveform memory 21 sequentially stores output values from the sampling circuit 18 as spectrum values. The waveform memory 21 has, for example, 500 addresses. A display unit 22 develops spectrum values stored in the waveform memory 21 and displays the spectrum values on a frequency axis.

A start frequency setting unit 30 sets a sweep start frequency F(st). A frequency span setting unit 31 sets a sweep frequency span F(sp). A frequency step setting unit 32 sets a sweep frequency step ΔF.

A sweep control unit 33 comprises a reception frequency variable unit 33a for increasing frequency data for the local oscillator 12 by ΔF and an address variable unit 33b for addressing the waveform memory 21 every time the reset signal is received from the reset signal generator 20.

FIG. 2 shows an arrangement of the sweep control unit 33.

Referring to FIG. 2, the frequency step ΔF set in the frequency step setting unit 32 is input to an adder 35 together with storage data of a register 34. A sum from the adder 35 is updated and set in the register 34 through a switch 36. The switch 36 is turned on every time the reset signal from the reset signal generator 20 is received.

A start frequency F(st) set in the start frequency setting unit 30 is added to the storage value of the register 34 in an adder 37. A sum from the adder 37 is output as frequency data for the local oscillator 12.

An address step calculation unit 38 multiplies a total address count P (500 in this case) of the waveform memory 21 with a value obtained by dividing the set frequency step ΔF by the frequency span F(sp) to calculate an address step of the waveform memory 21 in correspondence with the frequency step ΔF.

This address step ΔA is input together with the storage value of a register 39 to an adder 40. An output from the adder 40 updates the current value of the register 39 and is set therein through a switch 41. This switch 41 is turned on every time it receives the reset signal from the reset signal generator 20.

When the storage value of the register 34 becomes larger than the frequency span F(sp), a reset circuit 42 resets the registers 34 and 39.

The functions of the sweep control unit 33 can be achieved by a CPU and its peripheral circuits in practice.

An operation of the spectrum analyzer will be described below.

Figure 3:
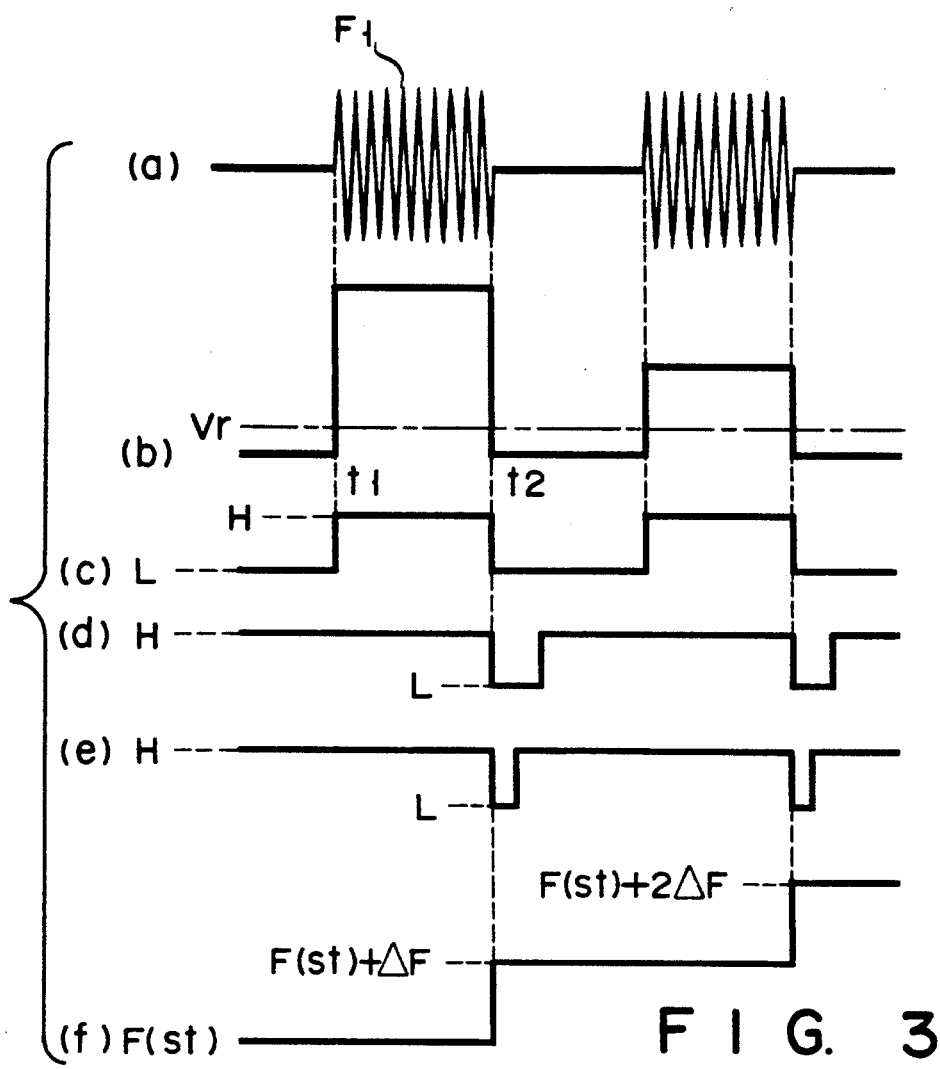
FIG. 3 is a timing chart for explaining an operation of the first embodiment.

For example, as shown in (a) of FIG. 3, when a harmonic measurement of a high-speed burst-modulated signal having a frequency $F_1$ is to be performed, the start frequency F(st) and the frequency step ΔF are set to $F_1$, and the frequency span is set to $F_2$ higher several times the frequency $F_1$ (in this case, assume that both the storage contents of the registers 34 and 39 of the sweep control unit 33 are set to "0").

By this setting, the local oscillator 12 outputs a local oscillation signal having a frequency obtained by adding an intermediate frequency to $F_1$. The frequency $F_1$ of a fundamental wave of the burst signal is set in a reception enable state.

At time t1 when a burst signal is input, as shown in (b) of FIG. 3, since a detection voltage exceeding the reference voltage Vr is input to the comparator 15, the output from the comparator 15 rises to "H" level, as shown in (c) of FIG. 3, thereby turning on the switch 16.

A peak value of a detection output obtained while the switch 16 is ON is held by the peak hold circuit 17. At time t2 when the burst signal is set in a non-signaling state, a sampling signal falling in synchronism with the trailing edge of the output from the comparator is output from the sampling signal generator 19, as shown in (d) of FIG. 3.

Spectrum data sampled at time t2 by this sampling signal is stored in the waveform memory 21 addressed ("0" in this case) by an output value of the register 39 in the sweep control unit 33.

When a reset signal shown in (e) of FIG. 3 slightly delayed from time t2 is output from the reset signal generator 20 to the peak hold circuit 17 and the sweep control unit 33, the peak hold circuit 17 is reset, and the switches 36 and 41 in the sweep control unit 33 are turned on. The reception frequency (frequency data input to the local oscillator 12) of the measuring unit 10 is changed stepwise to F(st)+ΔF, i.e., $2F_1$, as shown in (f) of FIG. 3. A burst signal input again at time t3 is received at a frequency $2F_1$, i.e., a frequency at which a second harmonic component is present.

Similarly, when a burst signal is input and its detection output voltage is higher than the reference voltage Vr, the apparatus is shifted to a state for receiving harmonic waves of higher orders.

Figure 4:
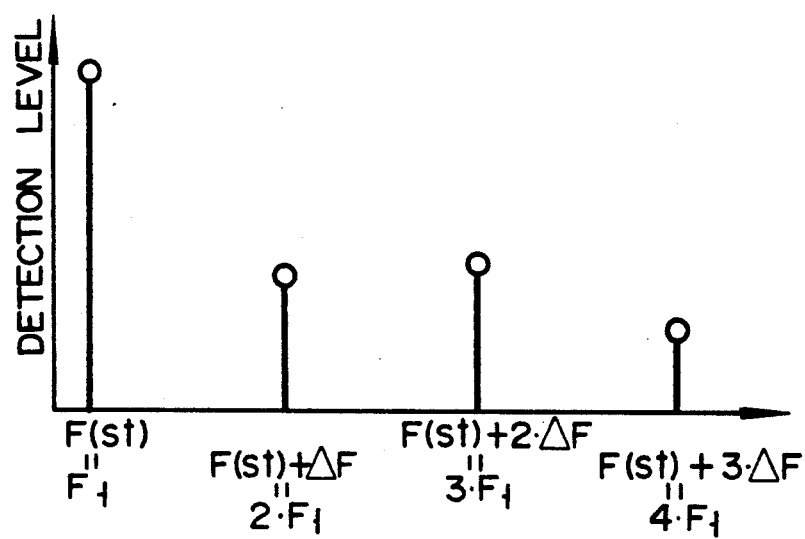
FIG. 4 is a view showing a display screen of the first embodiment.

As described above, spectrum data stored in the waveform memory 21 by step sweep for every frequency $F_1$ is read out by the display unit 22. As shown in FIG. 4, the readout spectrum data is displayed as a spectral line shape on the frequency axis. The level of the fundamental wave of the input burst signal and the levels of its harmonic components are observed on this display screen.

Since the local oscillator 12 in the measuring unit 10 comprises a synthesizer type oscillator having frequency stability much higher than that of an analog oscillator, even if a nonsignaling state of the burst signal continues for a relatively long period of time, a measurement error caused by a frequency drift and nonlinearity of the sweep frequency does not occur. Observation having high reproducibility can be performed.

In the above embodiment, the frequency step is set to the frequency of the fundamental wave of the burst signal, and measurements of this fundamental wave and its harmonic components are performed at the respective points. If a frequency step is larger than a value obtained by dividing the frequency span F(sp) by the address count P of the waveform memory 21, arbitrary setting can be performed.

The frequency step need not be a permanent value. For example, like a reception frequency variable unit 50 shown in FIG. 5, an arbitrary reception frequency (or an arbitrary frequency step) may be stored in a frequency table 51, and the reception frequency may be set variable stepwise in accordance with frequency data read out in response to an output from a counter 52 for counting an output count of the sampling or reset signals.

As shown in FIG. 6, after components near the spectrum are swept by the small frequency step $\Delta F_1$, sweeping may be performed near the next spectrum by a large frequency step $\Delta F_2$.

In this embodiment, the input of the burst signal is detected by the detection output from the measuring unit 10. However, as shown in FIG. 7, a measuring signal may be detected by a wide-band detector 60, and a detection voltage signal therefrom may be input to the comparator 15. Even if a spectrum having a high level is not present in the initial reception frequency (start frequency), stepwise sweep can be started.

Figure 8:
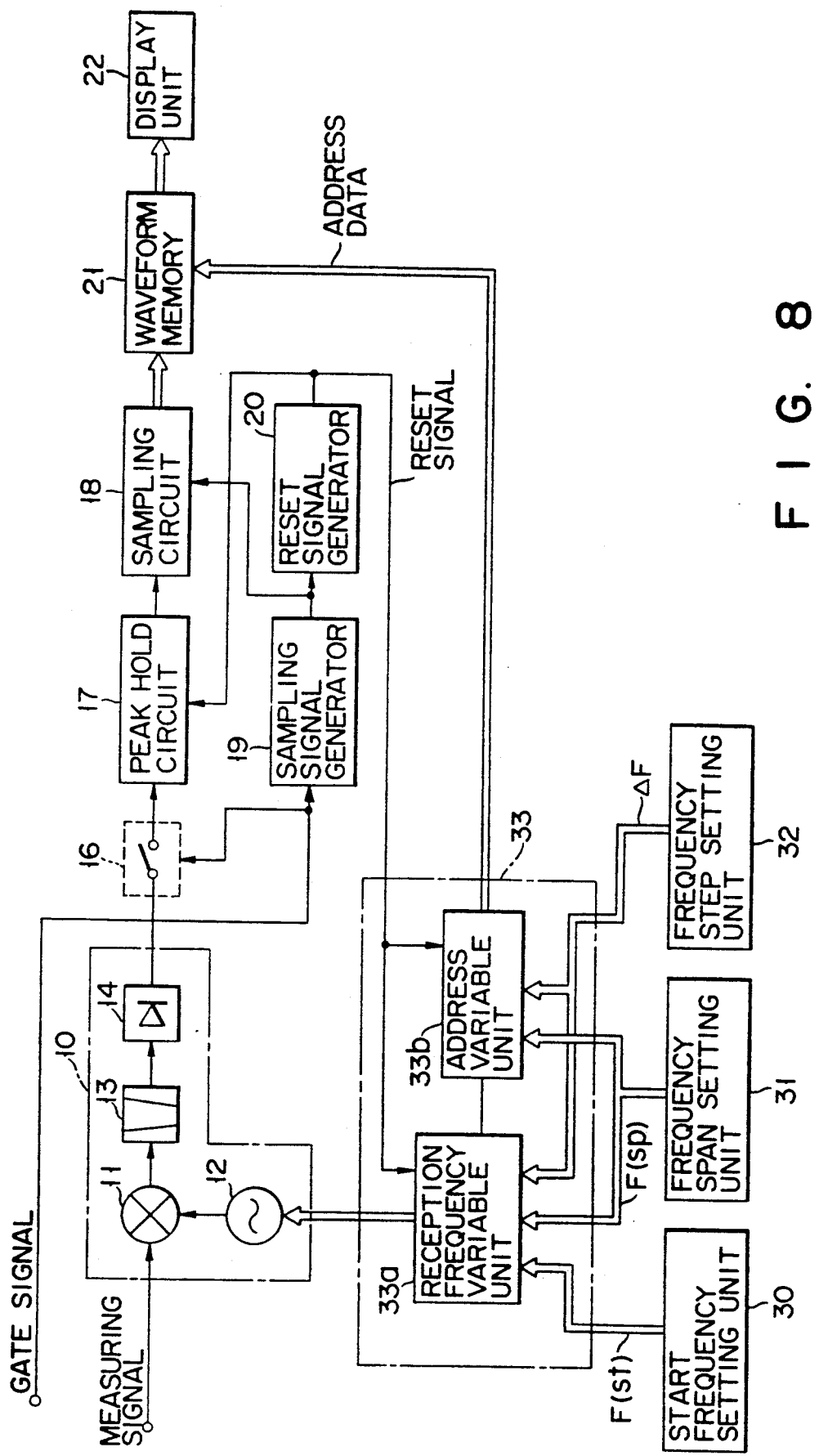

In the above embodiment, sampling of the detection output and stepwise sweep are started by an input level of a burst signal. However, as shown in FIG. 8, an external gate signal synchronized with a burst period may be input in place of a comparator output. In this case, even if disturbance noise is input in a non-signaling state, the step variable unit for the reception frequency in the measuring unit is not started.

In addition, in this case, one (e.g., $W_a$) of a plurality of signals (e.g., $W_a$, $W_b$, and $W_c$) having different frequency distributions and generated in a time-serial order (e.g., $W_a$, $W_b$, $W_c$, $W_a$, $W_b$, $W_c$) can be extracted in accordance with an external gate signal and can be analyzed.

In the spectrum analyzer according to the first embodiment, reception of a signal component of an analysis target frequency corresponding to preset frequency data can be switched in synchronism with the ON/OFF change of the measuring signal. Spectra such as that of a burst signal modulated with a high-speed pulse can be accurately measured in a state free from an unobservable range.

The second embodiment of the present invention will be described below.

In this embodiment, a description of a method is incorporated in a description of an apparatus because the method is described in the form of control of the apparatus. In particular, the description of the method is included in a series of operation descriptions in item (2) below.

FIG. 9 (I and II) shows an arrangement of a spectrum analyzer according to the second embodiment of the present invention.

The arrangement of FIG. 9 (I and II) mainly describes components required to practice the present invention. Components required when the apparatus is used as a general spectrum analyzer but not required for practicing the present invention are not described.

According to the present invention, when a burst measurement key 7a of function keys 7 in FIG. 9 (I and II) is set, spectrum analysis of a burst signal is performed by the spectrum analyzer. When a normal measurement key 7b is set, general spectrum analysis is performed. The arrangement and operation upon operation of the normal measurement key 7b will be omitted.

FIG. 9 (I and II) shows an arrangement obtained by systematizing the respective parts of the first embodiment and adding some new components thereto. In principle, the arrangement of FIG. 9 incorporates a function of spectrum analysis of a burst signal and enhances this function.

The arrangement of FIGS. 9-I and 9-II will be described in units of blocks.

(1) Description of Arrangement

The main arrangement will be described first.

(1-1) Reception Unit 1

Referring to FIGS. 9-I and 9-II, a reception unit 1 includes a local oscillator 1a, a mixer 1b, a band-pass filter (BPF) 1c for determining a resolution bandwidth, and an IF detector 1d. The frequency of a signal to be measured is converted into an intermediate frequency ($F_{if}$) in accordance with the frequency of a local signal from the local oscillator 1a, the intermediate frequency is analyzed by the BPF 1c, and its IF detection is performed by the IF detector 1d. The IF-detected signal is finally output.

The frequency of the local oscillator 1a is variably set stepwise and the local oscillator 1a is accurately locked with the accurate reference signal at the set frequency in a burst signal measurement mode (i.e., when the burst measurement key 7a is set). The output frequency of the local oscillator 1a is a frequency higher than the set frequency (i.e., a frequency to be measured) by an intermediate frequency $F_{if}$. Note that the frequency of the local oscillator 1a is set stepwise by a frequency control unit 3 before or after the level is measured.

(1-2) Frequency Setting Unit 2

A frequency setting unit 2 sets information required for causing the frequency control unit 3 to determine a measuring frequency, i.e., the oscillation frequency of the local oscillator 1a. In this arrangement, the frequency setting unit 2 comprises a start frequency (Fst) setting unit 2a, a frequency step ($\Delta F$) setting unit 2c, and a total measuring frequency span (Fsp) setting unit 2b for setting a stop measuring frequency which is an integer multiple (n−1 times) the frequency step $\Delta F$.

(1-3) Frequency Control Unit 3

A frequency storage unit 3a stores frequency information set by the frequency setting unit 2 and outputs the stored frequency information to a reception frequency variable unit 3b after an initialization setting signal from a function control unit 8 (to be described later) is received upon an operation of the burst measurement key 7a. The reception frequency variable unit 3b sequentially determines a predetermined number n of measuring frequencies from the first measuring frequency to the nth measuring frequency, i.e., measuring frequencies Fst, Fst+$\Delta F$, Fst+$2\Delta F$, . . . , Fst+(n−1)$\Delta F$ (=Fst+Fsp) on the basis of the frequency information and sets these measuring frequencies in the local oscillator 1a. The measuring frequencies are set in the local oscillator 1a after the frequency storage unit 3a receives the signal (so-called initialization setting signal) set by the burst measurement key 7a. The local oscillator 1a is set at an oscillation frequency for receiving the first measuring frequency Fst. Thereafter, every time a reset signal (so-called end signal of the measuring time) output from a measuring time setting unit 4 is received, the oscillation frequencies for receiving the measuring frequencies from the second measuring frequency Fst+$\Delta F$ to the nth measuring frequency Fst+(n−1)$\Delta F$ are set stepwise in the local oscillator 1a.

An address variable unit 3c determines an address of a waveform memory 9 in correspondence with a measuring frequency. If all addresses of the waveform memory 9 are defined as addresses 0, 1, 2, . . . , P−1 corresponding to the total measuring frequency span, address 0, address P/n, address 2P/n, . . . , address P−1 are determined in correspondence with the measuring frequencies Fst, Fst+$\Delta F$, Fst+$2\Delta F$, . . . , Fst+(n−1)$\Delta F$, respectively, and are output as address data, thereby addressing the waveform memory 9.

The timings for causing the address variable unit 3c to address the waveform memory 9 are the same as those for setting the measuring frequencies in the local oscillator 1a.

A detailed arrangement of the frequency control unit 3 is shown in FIG. 10 and is substantially the same as that of the first embodiment.

The arrangement of the frequency control unit 3 will be described with reference to FIG. 10.

Referring to FIG. 10, the start frequency Fst, the frequency step $\Delta F$, and the total measuring frequency span Fsp stored in the frequency storage section 3a are set in the reception frequency variable unit 3b and the address variable unit 3c in accordance with the initialization setting signal from the burst measurement key 7a (FIGS. 9-I and 9-II). In this case, when a reset circuit 3b-5 receives the total measuring frequency span Fst, registers 3b-2 and 3c-1 are cleared, thereby setting the first measuring frequency Fst. An adder 3b-1, a switch 3b-4, and the register 3b-2 constitute an addition loop every time a reset signal is received from a reset signal generator 4f (to be described later). The addition loop sequentially accumulates the step frequencies $\Delta F$, and the accumulated value is stored in the register 3b-2. At the same time, the accumulated value is output to an adder 3b-3. This addition loop is cleared in response to a signal from the reset circuit 3b-5 when the value becomes $(n-1)\Delta F$ ($=Fsp$). The adder 3b-3 adds the value Fst and the value from the register 3b-2 and sets the output sum as frequency setting data in the local oscillator 1a.

An address step calculating unit 3c-4 calculates the next value and outputs it to an adder 3c-2:

$$\frac{\text{(Frequency Step } \Delta F) \times \text{(Total Address Count } P)}{\text{Total Measuring Frequency Span } Fsp} = \frac{P}{n}$$

The adder 3c-2, a switch 3c-3, and the register 3c-1 constitute an addition loop. Every time a reset signal is input to the addition loop, the loop accumulates values P/n output from the address step calculation unit 3c-4 until the accumulation value reaches P. The accumulation value is output to the waveform memory 9 as address data.

(1-4) Measuring Time Determining Unit 4

The measuring time determining unit 4 determines start and end times of measurement during an ON interval of the burst signal, i.e., a measuring time, and controls a level detector 5 at the measurement start and end timings. Modes summarized in Table 1 below are obtained in accordance with different reference signals for determining the measuring time. Any mode can be selected in accordance with the selective operation of an IF detection mode key 7a-1, a wide-band detection mode key 7a-2, or an external synchronization key 7a-3 of the function keys 7 and the selective operations of switches 4b and 4d.

TABLE 1

| Switch | | | | Synchronization Reference Signal | Name of Synchronization Mode | Application |
|---|---|---|---|---|---|---|
| 4b | | 4d | | | | |
| 1 | m | 1 | m | | | |
| OFF | ON | OFF | ON | Input | Wide-band detection mode | Measurement of known and unknown components |
| ON | OFF | OFF | ON | IF | IF detection mode | Measurement of known component |
| — | — | ON | OFF | External | External synchronization mode | Measurement of unknown and known components |

The timings in the IF detection mode in Table 1 are shown in FIG. 11.

a) IF Detection Mode

An input burst signal as shown in (a) of FIG. 11 is converted into an IF signal by the reception unit 1, and the envelope of the IF signal is detected by the IF detector 1d. The waveform of the detected voltage as shown in (b) of FIG. 11 is compared with reference voltage Vr by a comparator 4c, and a comparison signal is output as a gate signal as shown in (c) of FIG. 11.

During the interval between time t1 and time t2 of the gate signal, a gate circuit 5a in the level detector 5 is turned on to actually measure the level of the measuring frequency. A peak value of the level of the measuring frequency during the interval between time t1 and time t2 is held by a peak hold circuit 5b. The value output from the peak hold circuit 5b is received as spectrum data in response to the trailing edge of the signal from a sampling circuit 5c at time t2 and is stored at a predetermined address of the waveform memory 9. Thereafter, the value held in the peak hold circuit 5b is reset in response to a trailing edge of a reset signal from the reset signal generator 4f output at time t3. The next measuring frequency is set in the local oscillator 1a at time t3 in response to this reset signal.

In this IF detection mode, when the level of the measuring frequency component included in the burst signal becomes the reference voltage Vr or less, the circuits from the comparator 4c are not operated. Therefore, the level of the measuring frequency component must be the reference voltage Vr or more and must be known in advance.

In the IF detection mode, since the comparator 4c is operated on the basis of the burst signal received through the BPF 1c, a high S/N ratio can be obtained.

b) Wide-Band Detection Mode

In this mode, the envelope of an input burst signal is detected by a wide-band detector 4a, and the detection signal is input to the comparator 4c. Operations from the operation of the comparator 4c are the same as those in the IF detection mode.

In this case, the measuring time determining unit 4 is operated regardless of the magnitude of the level of the measuring frequency component included in the burst signal. This mode is convenient when the presence/absence of the measuring frequency component included in the burst signal is unknown.

c) External Synchronization Mode

For example, when a transmitter located near the apparatus is to be tested, and a signal synchronized with a burst signal is generated by this transmitter and is input as an external synchronization signal, the measuring time determining unit 4 receives this signal and is operated. In this case, the synchronization relationship is properly established.

(1-5) Level Detector 5, Waveform Memory 9, and Display Unit 6

The level detector 5 receives an output signal from the reception unit 1 and stores a peak value within an interval determined by the measuring time determining unit 4 in the waveform memory 9 in correspondence with the measuring frequency. This operation complies with a) of the IF detection mode of item (1-4) of the measuring time determining unit 4.

A display unit 6 displays the level of each measuring frequency component stored in the waveform memory 9 in correspondence with each measuring frequency. The address corresponding to the frequency axis as the abscissa on the display screen is the same as that of the waveform memory 9.

(1-6) A function control unit 8 initializes the reception frequency variable unit 3b to start a measurement in response to the initialization setting signal when the burst measurement key 7a is set. The function control unit 8 also sets an arbitrary bandwidth of the BPF 1c during burst measurement. This bandwidth is preferably larger than that of the leading edge of the burst component of the signal to be measured.

In practice, the functions of the function control unit 8 and the frequency control unit 3 can be achieved by a CPU and its peripheral circuits.

(2) Description of Series of Operations

A series of operations will be described on the basis of the timing chart of FIG. 11 and a flow chart of FIG. 12.

Figure 12:
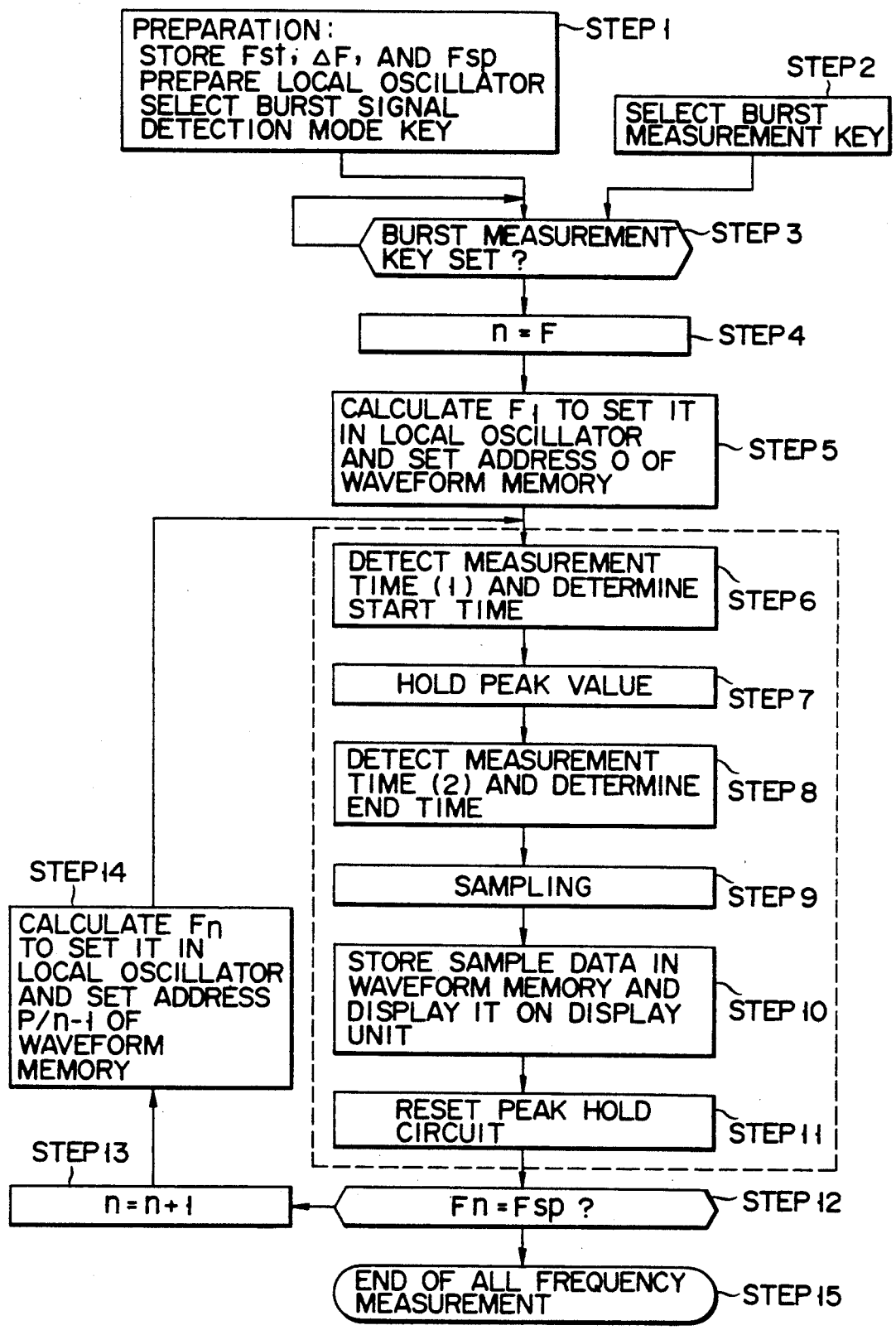
FIG. 12 is a flow chart for explaining an operation of the second embodiment.

(2-1) Preparation of Measuring Frequency [Step 1 in FIG. 12]

The frequency information set by the frequency setting unit 2, i.e., the start frequency Fst, the frequency step $\Delta F$, and the total frequency span Fsp which is an integer multiple (n−1 times) of the frequency step $\Delta F$, are stored in the frequency storage unit 3a.

An actual measurement of a harmonic component will be exemplified below. For example, assume an integer n=4 and Fst=$\Delta F$. In this case, the measuring frequencies are $F_1$=Fst, $F_2$=2Fst, $F_3$=3Fst, and $F_4$=4Fst. This case is an application for simultaneously measuring the level of the fundamental wave frequency Fst and the levels of the second- to fourth-order harmonic components.

The reception frequency variable unit 3b is set in a state wherein the measuring frequencies $F_1$=Fst, $F_2$=2Fst, $F_3$=3Fst, and $F_4$=4Fst are calculated and output on the basis of the start frequency Fst, the frequency step $\Delta F$, and the total measuring frequency span Fsp, all of which are stored in the frequency storage unit 3a, if a measurement start command is input.

(2-2) Preparation of Local Oscillator 1a [Step 1 in FIG. 12]

As described with reference to the above arrangement, the spectrum analyzer according to this embodiment oscillates at a local frequency $F_1$ obtained by adding the intermediate frequency $F_{if}$ to the measuring frequency set stepwise and is locked with the reference frequency.

(2-3) Setting of Burst Signal Detection Mode [Step 1 in FIG. 12]

In this case, the IF detection mode in Table 1 is selected with the IF detection mode key 7a-1.

(2-4) Start of First (F1) Measurement [Steps 1 to 5 in FIG. 12]

A burst signal as a signal to be measured is input, and the burst measurement key 7a is set.

The function control unit 8 receives a signal representing that the burst measurement key 7a is set and sets the frequency information stored in the frequency storage unit 3a in the reception frequency variable unit 3b.

The reception frequency variable unit 3b sets the measuring frequency $F_1$=Fst in the local oscillator 1a.

The address variable unit 3c sets the address 0 of the waveform memory 9.

The local oscillator 1a oscillates a local frequency $F_{11}$=Fst+$F_{if}$ locked with the reference frequency.

The BPF 1c outputs an intermediate frequency signal during the ON interval of the burst signal.

(2-5) Determination of First Measuring Time [Steps 6 and 8 in FIG. 12]

As shown in (b) and (c) of FIG. 11, the IF detector 1d detects the envelope of the intermediate frequency signal, and the comparator 4c compares this envelope voltage signal with the reference voltage Vr to output a gate signal. This gate signal enables the gate circuit 5a. The ON time of the gate signal, i.e., the interval between time t1 and time t2 as shown in (c) of FIG. 11 is the measuring time.

(2-6) First Level Detection ($F_1$ Level Detection) [Steps 7 to 11 in FIG. 12]

As shown in (d) of FIG. 11, the peak hold circuit 5b detects the peak value of the voltage output from the IF detector 1d during the interval between time t1 and time t2 and holds the detected peak value.

A sampling signal generator 4e outputs a sampling signal at time t2, as shown in (e) of FIG. 11.

In response to the sampling signal, the sampling circuit 5c samples the peak value held by and output from the peak hold circuit 5b, and the sampled signal is output to the waveform memory 9.

The waveform memory 9 stores the sampled peak value at the address (address 0) designated by the address variable unit 3c.

The display unit 6 displays the level (peak value) corresponding to the measuring frequency $F_1$=Fst, as shown in (h) of FIG. 11.

(2-7) Start of Second Measurement [Steps 11 to 14 in FIG. 12]

The reset signal generator 4f outputs a reset signal at time t3 after time t2, as shown in (f) of FIG. 11.

The peak value held by the peak hold circuit 5b in the first measurement is reset at time t3 in response to the reset signal, and the peak hold circuit 5b is prepared for the second measurement.

The reception frequency variable unit 3b receives the reset signal and sets the measuring frequency $F_2$=2Fst of the second measurement in the local oscillator 1a, as shown in (g) of FIG. 11.

The address variable unit 3c accesses address P/n of the waveform memory 9.

The local oscillator 1a oscillates the local frequency $F_{12}$=2Fst+$F_{if}$ locked with the reference frequency.

(2-8) Second ($F_2$) Measurement and Start of Third Measurement [Steps 6 to 14 in FIG. 12]

The level measurement of the measuring frequency $F_2$=2Fst is performed by the same operations as in steps (2-4) to (2-6), and the measurement value is stored at address P/3 of the waveform memory 9.

The display unit 6 displays the level in correspondence with the measuring frequency $F_2$=2Fst, as shown in (h) of FIG. 11.

Thereafter, the start of level measurement of the measuring frequency $F_3$=3Fst is performed as in step (2-7).

(2-9) Measurement from Third Measurement ($F_3$ and $F_4$)

Level measurements of the measuring frequencies $F_3$ and $F_4$ are performed by repeating the steps (2-4) to (2-8). As a result, the levels of the measuring frequencies $F_3$=3Fst and $F_4$=4Fst are measured, and the measurement values are respectively stored at addresses 2P/n and 3P/n of the waveform memory 9. The stored levels are displayed on the display unit 6 in correspondence with the measuring frequencies.

(2-9) End of Measurement [Steps 11 to 14 in FIG. 12]

The reset circuit 3b-5 in the reception frequency variable unit 3b detects that measurements have been performed up to the measuring frequency $F_4$ and initializes the measuring frequencies and the addresses of the waveform memory 9, thereby completing a series of operations. In this arrangement, after the initial state is obtained, the measurements from step (2-4) are repeated.

In the above operations, the level measurement and display operations are repeated in each measurement stage. However, levels may be displayed after all the measurements are completed.

The display contents of all the measured frequencies are shown in FIG. 13. These contents are substantially the same as the measurement results shown in FIG. 6 of the first embodiment.

As described above, if the input signal is a PSK-modulated signal such as a $\pi/4$-shifted QPSK signal, its amplitude is constantly changed. In this case, if frequency components are not measured throughout the entire burst range, its maximum peak cannot be detected. The present invention is based on peak detection in one burst range while the reception frequency is fixed at each frequency point. Therefore, the characteristics of any burst signal can be sufficiently analyzed regardless of its modulation schemes.

The present invention is not limited to the burst signal as its object. For example, even if three different signals, i.e., Wa, Wb, and Wc are continuously and repeatedly input, only the signal Wa can be received as an external synchronization signal, thereby analyzing the spectrum of this frequency component.

In addition, as described in the above embodiments, when only frequency components discretely distributed like harmonic components are to be measured, the frequency setting unit 2 can be set for only the target frequencies, thereby eliminating measurement of unnecessary frequency components and hence performing high-speed measurements.

The frequency control unit 3 may be arranged, as shown in FIG. 14. In this case, the frequency setting unit 2 is arranged to receive the absolute value of a measuring frequency and write it in a frequency table 3d. The frequency table 3d outputs frequency data to the local oscillator 1a in a predetermined order every time an initialization setting signal or reset signal is input.

Figure 15:
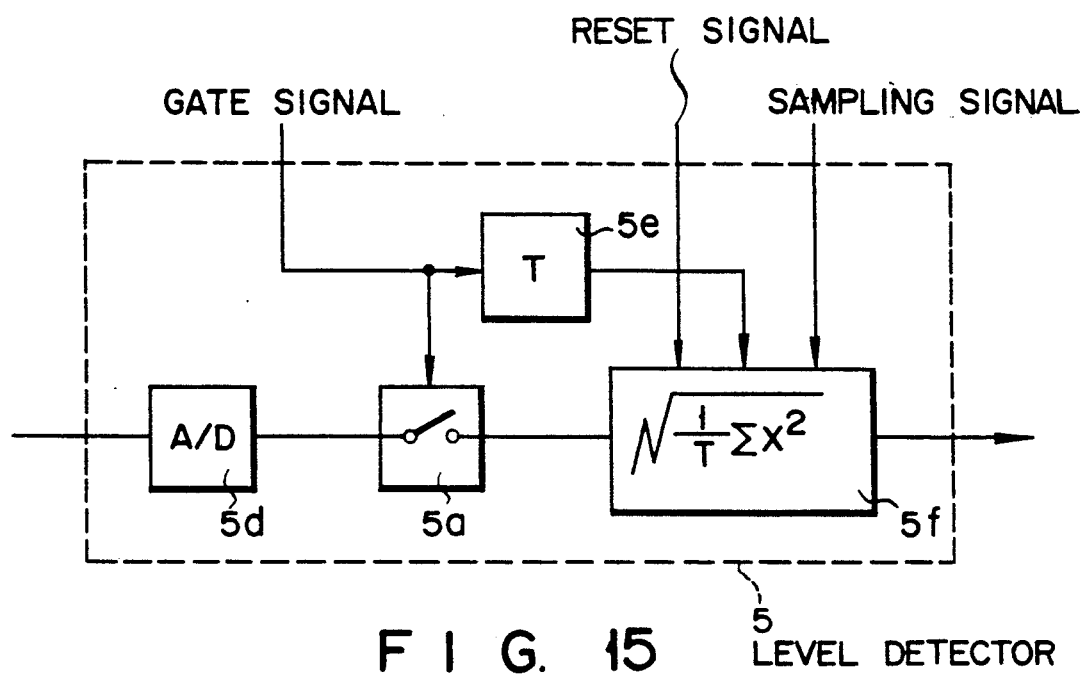
FIGS. 15 and 16 are block diagrams showing other arrangements of the level detector according to the second embodiment of the present invention.

FIG. 15 shows another arrangement of a level detector 5 according to the second embodiment as shown in FIGS. 9-I and 9-II. Referring to FIG. 15, the level detector 5 comprises a gate circuit 5a, an A/D converter 5d, a gate time measuring unit 5e, and a root-mean-square (r.m.s) calculating unit 5f.

The gate time measuring unit 5e measures the ON interval of the gate signal and transmits measured time T to the r.m.s calculation unit 5f. The A/D converter 5d always performs conversion of the time T at a period which can be divided into a plurality of times (e.g., 100 times). The resultant data is supplied from the A/D converter 5d to the r.m.s calculation unit 5f through the gate circuit 5a. The calculation content of the r.m.s calculation unit 5f is cleared in response to the reset signal. The r.m.s calculation unit 5f then performs an accumulation calculation of $$\sqrt{\frac{1}{T}\Sigma x^2}$$

(where T is given from the gate time measuring unit 5e) for data x supplied through the gate circuit 5a and completes this calculation in response to a sampling signal, thereby outputting the calculation result to the waveform memory 9.

When the IF detector 1d performs logarithmic conversion, the r.m.s calculation unit 5f performs the following calculation:

$$10\log_{10}\left(\sqrt{\frac{1}{T}\Sigma(10^{\frac{2X}{10}})}\right)$$

Figure 16:
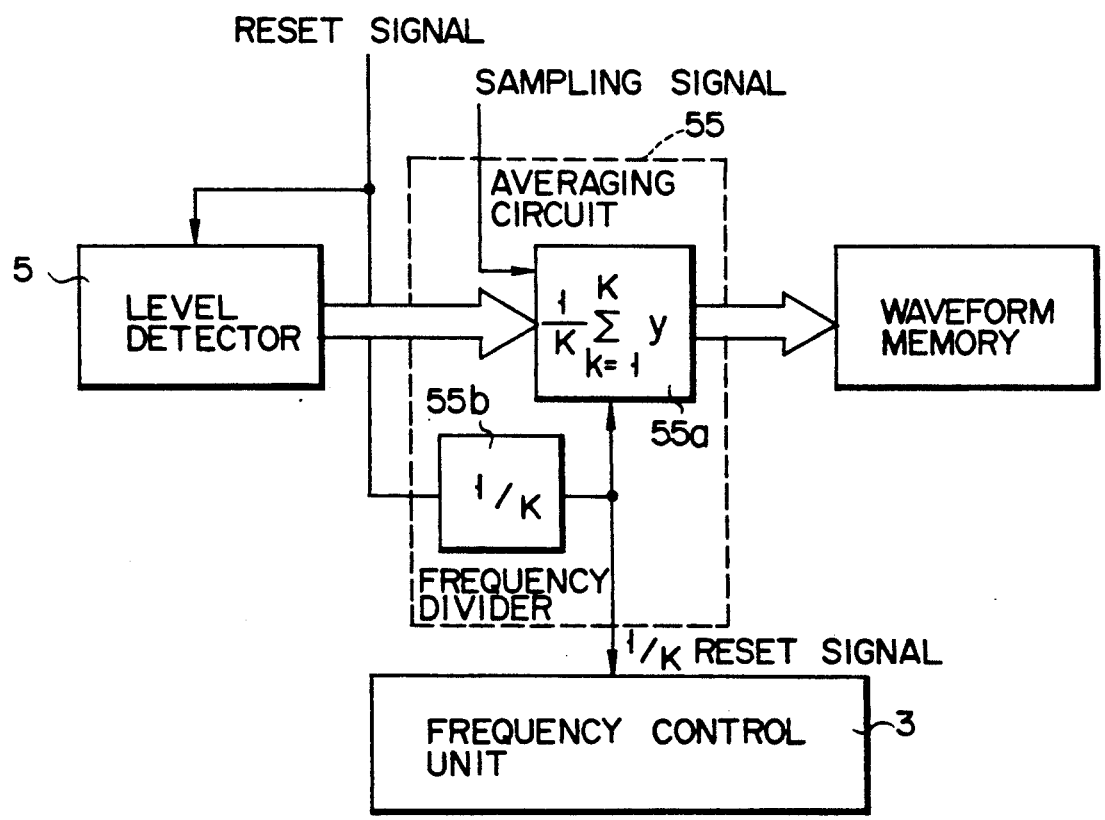
Figure 17:
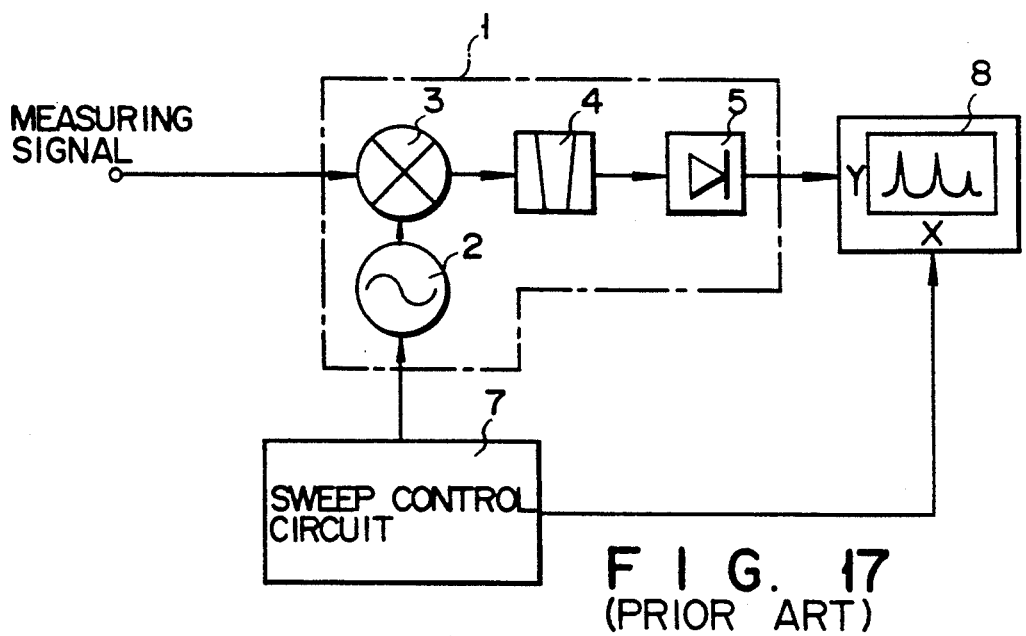
Figure 18A:
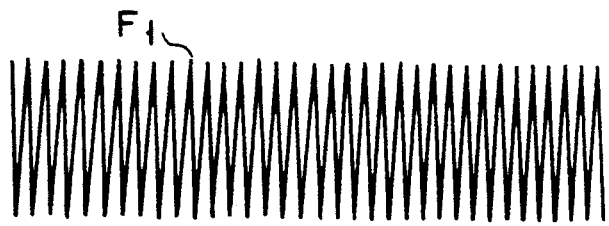
FIGS. 18A to 22 are views for explaining an operation of the conventional apparatus.
Figure 18B:
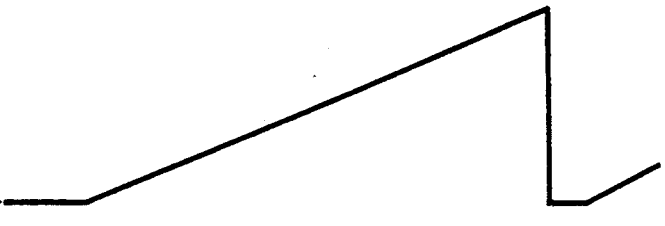
Figure 18C:
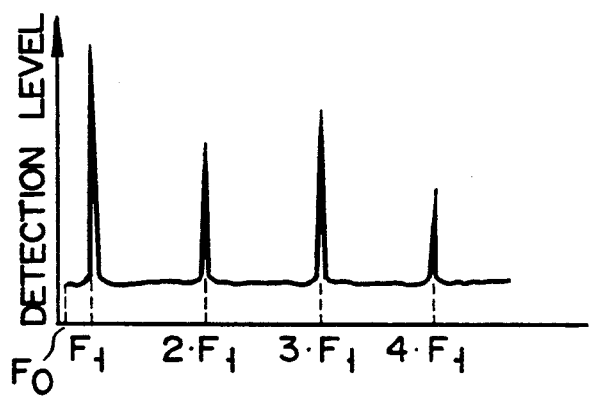
Figure 19:
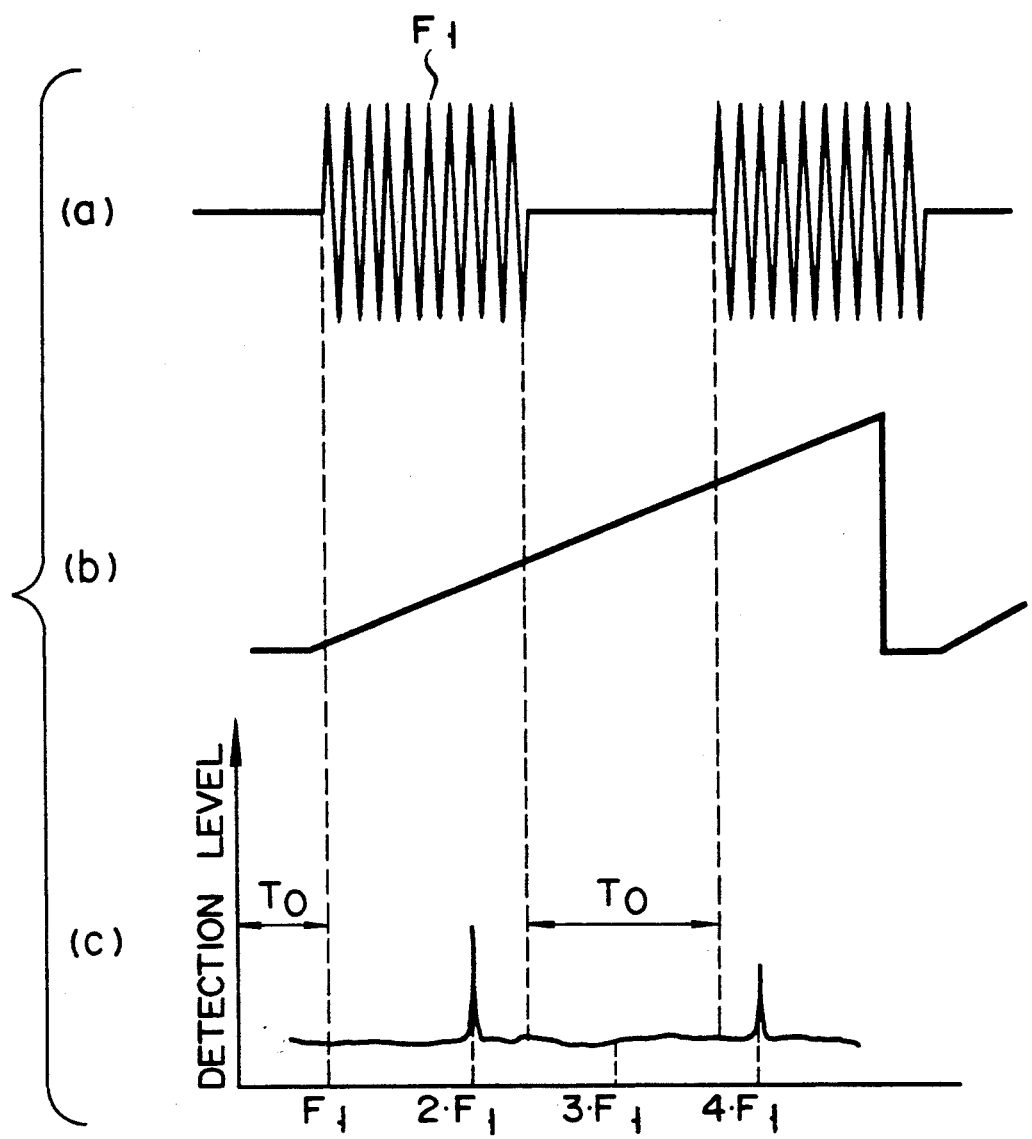
Figure 20:
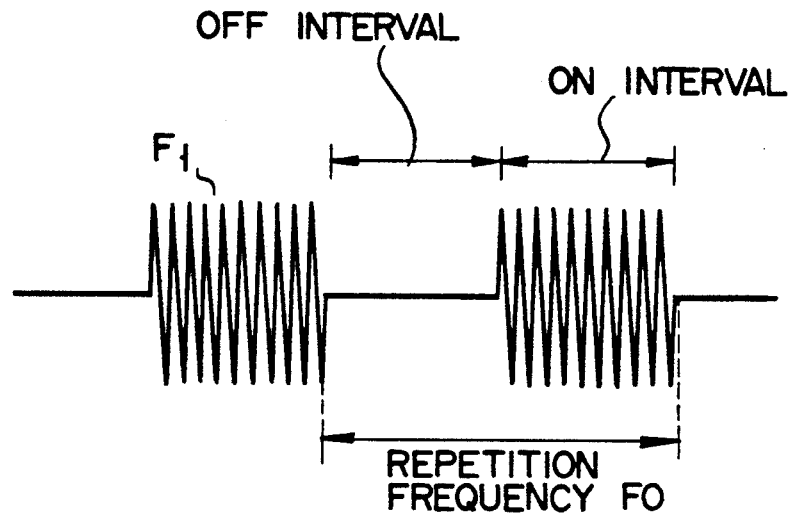
Figure 21:
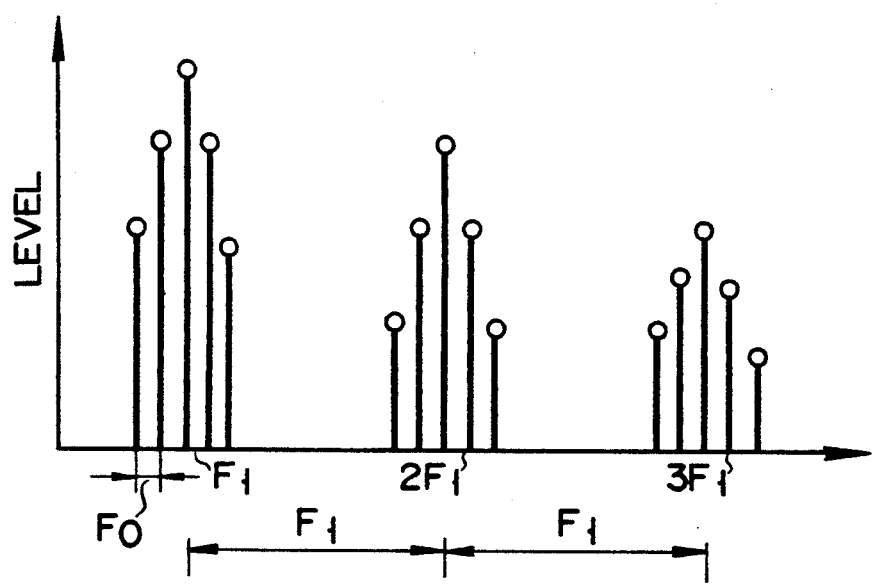
Figure 22:
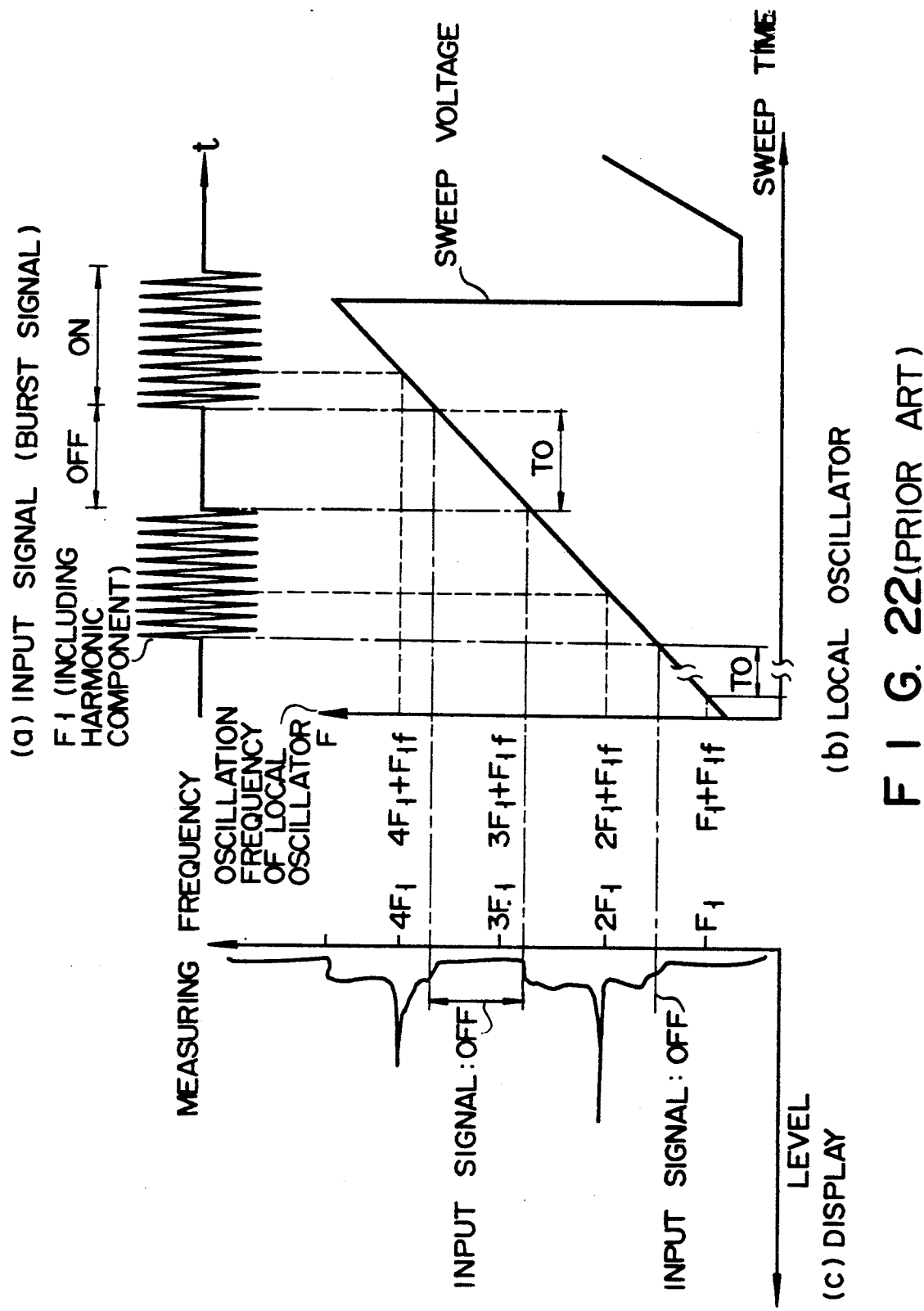

FIG. 16 shows still another arrangement based on the second embodiment of FIGS. 9-I and 9-II. While the system of FIGS. 9-I and 9-II switches the measuring frequency every burst component, the system of FIG. 16 switches the frequency every time K burst components are received and its average value is calculated. An averaging unit 55 is added in the arrangement of FIG. 16. The averaging unit 55 comprises an averaging circuit 55a for calculating an average value of the sum i.e., $$\frac{1}{K}\sum_{K=1}^{K}Y$$

of detection data y output for very burst component from the level detector and supplying the average value to the waveform memory, and a 1/K frequency divider 55b for initializing the averaging circuit 55a in response to a reset signal every time K-time averaging is completed, and outputting a 1/K reset signal to cause the frequency control circuit to update the reception frequency and the waveform memory to update its content. Note that the averaging circuit 55a and the 1/K frequency divider 55b are initialized prior to the start of measurement.

The arrangement of FIG. 16 requires averaging of the measurement results. The frequency switching time required for controlling the local frequency stepwise can be shortened to 1/K by performing K-time measurements at the same frequency.

This cannot be performed by an analog sweep spectrum analyzer and is a great advantage of this embodiment.

As has been described in detail above, the second embodiment of the present invention can effectively cope with spectrum analysis of the burst signal. In particular, there are provided a method of measuring the discrete spectra of the burst signal within a short period of time and measuring a peak value of the spectra of the burst signal, and a system for measuring a spectrum of the burst signal by stepwise sweep by means of a spectrum analyzer.

The present invention is not limited to the particular embodiments described above. At least one of the three operations for the start of measurement can be used:

① Initial values are set in the values such as the start frequency Fst, the frequency span Fsp, and the frequency step ΔF in FIG. 1 at the time of a power-ON operation, and at the same time the burst measurement is automatically set and started;

② The setting and measurement operations are performed by a manual means (the burst measurement key 7a) as in the above embodiments, and the measurement is started and ③ An external control interface such as a GP-IB is arranged, and external setting and measurement start commands are received and executed.

Furthermore, an address variable unit 3c may be used as a simple counter for generating consecutive values such as 0, 1, 2, 3, ..., and addresses 0, 1, 2, 3, ... of a waveform memory may be accessed in accordance with these values. Data stored at the addresses 0, 1, 2, 3, ... of the waveform memory may be displayed at positions corresponding to addresses 0, P/n, 2P/n, and 3P/n, ... of the waveform memory, respectively. In this case, a circuit equivalent to the address variable unit 3c in FIG. 10 is required in the waveform memory.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A spectrum analyzing apparatus comprising:
   receiving means including:
      for receiving a burst signal to be measured, said burst signal having a plurality of burst-on intervals,
      means for converting the burst signal into an intermediate frequency signal in accordance with a local oscillation signal having a predetermined swept frequency locked with a single frequency during each burst-on interval of the burst signal and differing among different burst-on intervals, and
      means for detecting the intermediate frequency signal, so as to output a signal representing a spectrum of the burst signal;
   frequency setting means for setting frequency information for determining a plurality of measuring frequencies from a first measuring frequency to an nth (where n is a natural number) measuring frequency;
   measuring time determining means for determining measurement start and end times in association with the burst signal and for outputting measurement start and end signals corresponding to the measurement start and end times;
   frequency control means for determining a desired number of measuring frequencies from an ith (where $1 \leq i < n$) measuring frequency to a kth (where $i < k \leq n$) measuring frequency in accordance with the frequency information set by sa said frequency setting means, and for stepwise-setting the predetermined swept frequency of the local oscillation signal in said receiving means at timings in accordance with an initialization signal and the measurement end signal from said measuring time determining means so as to sequentially output spectrum signals respectively corresponding to the desired number of measuring frequencies from the ith to kth measuring frequencies from said receiving means and such that the predetermined swept frequency is locked with a single frequency during each burst-on interval of the burst signal and differs among different burst-on intervals;
   level detecting means for dating on output signal from said receiving means between reception timings of the measurement start and end signals from said measuring time determining means, and sequentially detecting levels of the ith to kth measuring frequency components included in the burst signal as spectrum data in accordance with the gated output signal;
   waveform memory means for storing the spectrum data sequentially detected by said level detecting means at an address corresponding to the predetermined swept frequency set by said frequency control means; and
   display means for developing and displaying the spectrum data representing the ith to kth measuring frequency component levels stored in said waveform memory means on a frequency axis corresponding to the address.

2. An analyzer according to claim 1, wherein said measuring time determining means directly detects a change in level of the input burst signal to determine the measurement start and end times, and outputs the start and end signals respectively corresponding to the measurement start and end times.

3. An analyzer according to claim 1, wherein said measuring time determining means detects a change in level of an output signal from said reception unit to determine the measurement start and end times, and outputs the start and end signals respectively corresponding to the measurement start and end times.

4. An analyzer according to claim 1, wherein said measuring time determining means receives an external synchronization signal corresponding to the input burst signal to determine the measurement start and end times, and outputs the start and end signals respectively corresponding to the measurement start and end times.

5. An analyzer according to claim 1, wherein said level detecting means detects peak values of levels of the first to nth measuring frequencies included in the burst signal during an interval between the start and end times.

6. An analyzer according to claim 1, wherein said level detecting means includes an A/D converting circuit for converting the output signal from said receiving means into a corresponding digital signal (x), a gate circuit for gating the corresponding digital signal from said A/D converting circuit between reception timings of the measurement start and end signals from said measuring time determining means, a gate time measuring unit for measuring a gated time (T) according to the reception timings of the measurement start and end signals from said measuring time determining means and a root-mean-square calculation unit for performing an accumulation calculation of $$\sqrt{\frac{1}{T}\Sigma x^2}$$

in accordance with corresponding signal (x) from said A/D converting circuit and the gated time (T) from said gate time measuring unit.

7. An analyzer according to claim 6, wherein said root-mean-square calculation unit performs an accumulation calculation of $$10\log_{10}\left(\sqrt{\frac{1}{T}\Sigma(10^{\frac{2x}{10}})}\right)$$

when said receiving means performs a detection by logarithmic conversion.

8. An analyzer according to claim 1, wherein said analyzer further comprises averaging means provided between said level detecting means and said wave memory means, for causing said analyzer to switch the measuring frequency every time a plurality of burst components (K) are received are received and its average value is calculated, said averaging means comprising:

an averaging circuit for calculating an average value of the sum, i.e., $$\frac{1}{K} \sum_{k=1}^{K} y$$

of level detection data y output for every burst component from said level detecting means and supplying the average value to said waveform memory, and a 1/K frequency divider for initializing said averaging circuit in response to a reset signal every time K-time averaging is completed, and outputting a 1/K reset signal to cause the frequency control means to update to measuring frequency and said waveform memory to update its content.

9. An analyzer according to claim 8, wherein said reset signal is produced in accordance with the reception timings of the measurement start and end signals from said measuring time determining means.

* * * * *